United States Patent
Biswas et al.

(10) Patent No.: US 8,954,649 B2
(45) Date of Patent: *Feb. 10, 2015

(54) GARBAGE COLLECTION IN STORAGE DEVICES BASED ON FLASH MEMORIES

(75) Inventors: Sudeep Biswas, Delhi (IN); Angelo Di Sena, Castello di Cisterna (IT); Domenico Manna, Acerra (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/196,820

(22) Filed: Aug. 2, 2011

(65) Prior Publication Data

US 2011/0289266 A1 Nov. 24, 2011

Related U.S. Application Data

(63) Continuation of application No. 11/801,745, filed on May 9, 2007, now Pat. No. 7,991,942.

(51) Int. Cl.
*G06F 12/16* (2006.01)
*G06F 12/02* (2006.01)
*G11C 29/00* (2006.01)

(52) U.S. Cl.
CPC ............ *G06F 12/0246* (2013.01); *G11C 29/76* (2013.01); *G06F 2212/1032* (2013.01); *G06F 2212/7201* (2013.01); *G06F 2212/7205* (2013.01); *G11C 29/88* (2013.01)
USPC .......................... 711/103; 711/154; 714/6.13

(58) Field of Classification Search
CPC .... G06F 2212/72–2212/7211; G06F 12/0246; G06F 11/20; G11C 16/349–16/3495; G11C 29/04–29/50016; G11C 29/70–29/886

USPC .......... 711/103, 154, 156, 206; 714/4, 5, 6.1, 714/6.13; 707/813–820
See application file for complete search history.

(56) References Cited

U.S. PATENT DOCUMENTS

| | | | |
|---|---|---|---|
| 4,800,520 A | | 1/1989 | Iijima |
| 5,107,481 A | | 4/1992 | Miki et al. |
| 5,471,604 A | | 11/1995 | Hasbun et al. |
| 5,479,633 A | | 12/1995 | Wells et al. |
| 5,566,314 A | | 10/1996 | DeMarco et al. |
| 5,634,050 A | * | 5/1997 | Krueger et al. ........................ 1/1 |
| 5,832,493 A | | 11/1998 | Marshall et al. |

(Continued)

OTHER PUBLICATIONS

U.S. Appl. No. 12/075,991, filed May 9, 2007.

(Continued)

*Primary Examiner* — April Y Blair
*Assistant Examiner* — Nicholas Simonetti
(74) *Attorney, Agent, or Firm* — IP & T Group LLP

(57) ABSTRACT

A solution for managing a storage device based on a flash memory is proposed. A corresponding method starts with the step for mapping a logical memory space of the storage device (including a plurality of logical blocks) on a physical memory space of the flash memory (including a plurality of physical blocks, which are adapted to be erased individually). The physical blocks include a set of first physical blocks (corresponding to the logical blocks) and a set of second—or spare—physical blocks (for replacing each bad physical block that is unusable). The method continues by detecting each bad physical block. Each bad physical block is then discarded, so to prevent using the bad physical block for mapping the logical memory space.

27 Claims, 13 Drawing Sheets

(56) References Cited

U.S. PATENT DOCUMENTS

| | | | |
|---|---|---|---|
| 5,867,641 A * | 2/1999 | Jenett | 714/6.32 |
| 6,000,006 A * | 12/1999 | Bruce et al. | 711/103 |
| 6,104,638 A | 8/2000 | Larner et al. | |
| 6,170,066 B1 | 1/2001 | See | |
| 6,289,484 B1 * | 9/2001 | Rothberg et al. | 714/769 |
| 6,449,625 B1 * | 9/2002 | Wang | 1/1 |
| 6,513,095 B1 | 1/2003 | Tomori | |
| 6,834,331 B1 | 12/2004 | Liu | |
| 6,895,490 B1 | 5/2005 | Moore et al. | |
| 6,973,531 B1 * | 12/2005 | Chang et al. | 711/103 |
| 7,035,993 B2 * | 4/2006 | Tai et al. | 711/206 |
| 7,353,325 B2 | 4/2008 | Lofgren et al. | |
| 7,457,909 B2 * | 11/2008 | Di Sena et al. | 711/103 |
| 8,041,883 B2 | 10/2011 | Biswas et al. | |
| 2002/0199054 A1 | 12/2002 | Akahane et al. | |
| 2003/0093606 A1 | 5/2003 | Mambakkam et al. | |
| 2003/0158862 A1 | 8/2003 | Eshel et al. | |
| 2003/0165076 A1 | 9/2003 | Gorobets et al. | |
| 2004/0001370 A1 | 1/2004 | Nakayama | |
| 2004/0039872 A1 | 2/2004 | Takamizawa et al. | |
| 2004/0078666 A1 | 4/2004 | Aasheim et al. | |
| 2004/0255090 A1 | 12/2004 | Guterman et al. | |
| 2004/0268064 A1 | 12/2004 | Rudelic | |
| 2005/0144360 A1 | 6/2005 | Bennett et al. | |
| 2005/0188250 A1 | 8/2005 | Kurita et al. | |
| 2005/0289558 A1 | 12/2005 | Illowsky et al. | |
| 2006/0031710 A1 * | 2/2006 | Jo | 714/5 |
| 2006/0106972 A1 | 5/2006 | Gorobets et al. | |
| 2006/0155917 A1 | 7/2006 | Di Sena et al. | |
| 2006/0161723 A1 | 7/2006 | Sena et al. | |
| 2006/0184719 A1 | 8/2006 | Sinclair | |
| 2006/0271725 A1 | 11/2006 | Wong | |
| 2007/0016721 A1 | 1/2007 | Gay | |
| 2007/0033329 A1 | 2/2007 | Sinclair et al. | |
| 2007/0033374 A1 * | 2/2007 | Sinclair et al. | 711/203 |
| 2007/0083697 A1 | 4/2007 | Birrell et al. | |
| 2007/0113001 A1 | 5/2007 | Yamada | |
| 2007/0143531 A1 | 6/2007 | Atri | |
| 2007/0174549 A1 * | 7/2007 | Gyl et al. | 711/115 |
| 2007/0300037 A1 | 12/2007 | Rogers et al. | |
| 2008/0235306 A1 | 9/2008 | Kim et al. | |
| 2008/0282023 A1 | 11/2008 | Biswas et al. | |
| 2008/0282024 A1 | 11/2008 | Biswas et al. | |
| 2008/0282025 A1 | 11/2008 | Biswas et al. | |
| 2008/0282045 A1 | 11/2008 | Biswas et al. | |
| 2011/0087832 A1 | 4/2011 | Biswas et al. | |

OTHER PUBLICATIONS

U.S. Appl. No. 11/801,687, filed May 9, 2007.
U.S. Appl. No. 12/973,305, filed Dec. 20, 2010.
U.S. Appl. No. 13/273,141, filed Oct. 13, 2011.
U.S. Appl. No. 11/801,745, filed May 9, 2007.
Brown et al. (2000) "Fundamentals of Digital Logic with VHDL Design"; McGraw-Hill Higher Education:2-6.
Gal et al. (Jun. 2005) "Algorithms and Data Structures for Flash Memories"; ACM Computing Surveys; 37(2):138-163.
Gay (2003) "Design of Matchbox, the simple filing system for motes"; www.tinyos.net/tinyos-1.x/doc/matchbox-design.pdf.
Hill (2003) "System Architecture for Wireless Sensor Networks"; Univ. of CA, Berkeley.
Kang et al. (Oct. 22-25, 2006) "A Superblock-based Flash Translation Layer for NAND Flash Memory"; ACM; EMSOFT '06; Seoul, Korea; pp. 161-170.
Kim et al. (1999) "A New Flash Memory Management for Flash Storage System"; IEEE; COMPSAC '99.
Manning et al. (Feb. 2002) "YAFFS (Yet Another Flash File System)".
Mathur et al. (2006) "Capsule: An Energy-Optimized Object Storage System for Memory-Constrained Sensor Devices"; ACM; SenSys '06.
U.S. Appl. No. 11/801,742, filed May 9, 2007.

* cited by examiner

260 ⟶

| LB0 | LB1 | LB2 | LB3 | LB4 | LB5 | LB6 | LB7 | LB8 | LB9 |
|---|---|---|---|---|---|---|---|---|---|
| 0 | 1 | 2 | 3 | 4 | 5 | 6 | 7 | 8 | 9 |

255 ⟶

| LB9 | LB6 | ✗ | LB5 | LB6 | LB8 | LB4 | LB3 | | LB3 | LB1 | LB0 | LB2 |
|---|---|---|---|---|---|---|---|---|---|---|---|---|
| 0 | 1 | 2 | 3 | 4 | 5 | 6 | 7 | 8 | 9 | 10 | 11 | 12 |

GARBAGE COLLECTION IN STORAGE DEVICES BASED ON FLASH MEMORIES

PRIORITY CLAIM

The present application is a Continuation of U.S. patent application Ser. No. 11/801,745, filed May 9, 2007 now U.S. Pat. No. 7,991,942, which application is incorporated herein by reference in its entirety.

CROSS REFERENCE TO RELATED APPLICATIONS

This application is related to U.S. patent application Ser. No. 12/075,991, now U.S. Pat. No. 7,882,301, issued Feb. 1, 2011, entitled WEAR LEVELING IN STORAGE DEVICES BASED ON FLASH MEMORIES AND RELATED CIRCUIT, SYSTEM, AND METHOD, Ser. No. 11/801,687 entitled RESTORING STORAGE DEVICES BASED ON FLASH MEMORIES AND RELATED CIRCUIT, SYSTEM AND METHOD, and Ser. No. 11/801,742 entitled MANAGEMENT OF ERASE OPERATIONS IN STORAGE DEVICES BASED ON FLASH MEMORIES, which have a common filing date and owner and which are incorporated by reference.

TECHNICAL FIELD

Embodiments relate to the storage device field. More specifically, embodiments relate to the management of storage devices based on flash memories.

BACKGROUND

Storage devices based on flash memories have become very attractive in recent years. For example, they are commonly used as mass memories (also known as solid-state mass memories) in data processing systems. These storage devices are compact, robust and have low power consumption. Therefore, they are advantageous especially in portable systems (such as mobile telephones), which are typically supplied by batteries.

Each flash memory used to implement the above-mentioned storage devices can be erased only in blocks having a relatively large size (for example, 16-128 Kbytes). Therefore, once data has been written into the flash memory, this data cannot be updated any longer (unless the corresponding whole block is erased). In order to emulate operation of a random access device (such as in standard hard-disks), a translation layer is provided on top of the flash memory. The translation layer manages any update of the data stored in the flash memory by writing a new version thereof in a different area of the flash memory (at the same time updating corresponding mapping information).

A problem of the flash memory is that some of its blocks may be defective (or bad), and then unusable. Typically, the bad blocks are detected in a factory (before shipping the storage device) during a corresponding test process—such as of the Electrical-Wafer Sorting (EWS) type. Moreover, the bad blocks may appear in the field (during operation of the storage device). For example, this happens when the erasure of a block fails (because of an excessive wearing of its memory cells, which endurance to the erasures is intrinsically limited).

In order to alleviate this problem, it has been proposed to skip any bad block and to replace it with a next one in the flash memory that is good (i.e., available to be used). The technique is well suited to a sequential use of the storage device; however, it is very difficult to apply when the storage device must support a random access.

Another approach that has been used consists of providing a set of spare (or redundancy) blocks, which are reserved for replacing the bad blocks. The bad blocks are then mapped on the corresponding spare blocks by means of a replacement table (for example, of the associative type). Particularly, for each bad block the replacement table stores an indication of the spare block to be used in substitution of the bad block. Before performing any operation on a current block of the flash memory, an entry in the replacement table for the current block is searched. If the entry is not found, the operation is performed on the (good) current block. Conversely, the operation is performed on the spare block associated with the (bad) current block in the replacement table.

A drawback of the solution described above is that it involves a large waste of area of the flash memory for implementing the spare blocks. Indeed, the spare blocks are used only when they must replace corresponding bad blocks. Otherwise, the spare blocks are completely useless. As a result, the number of spare blocks is generally maintained relatively low (for example, several units). However, this strongly reduces the capability of ensuring the correct operation of the flash memory with a high number of bad blocks.

Moreover, every operation on the flash memory requires the above-mentioned search in the replacement table (for a possible spare block associated therewith). Therefore, this adversely affects an access time of the storage device.

In this respect, it should be noted that the time that is spent to search an entry for the current block in the replacement table depends on its size. This further limits the number of spare blocks that can be provided. The problem is particularly acute when the flash memory has a very large size. Indeed, the overhead in the access time increases with the number of the spare blocks, so that it should be kept low in absolute terms to ensure an acceptable access time. Therefore, the number of spare blocks decreases in relative terms as the size of the flash memory increases.

SUMMARY

In general embodiments are based on the idea of managing bad blocks dynamically.

More specifically, an embodiment proposes a method for managing a storage device based on a flash memory. The method starts with the step for mapping a logical memory space of the storage device (including a plurality of logical blocks) on a physical memory space of the flash memory (including a plurality of physical blocks, which are adapted to be erased individually). The physical blocks include a set of first physical blocks (corresponding to the logical blocks) and a set of second—or spare—physical blocks (for replacing each bad physical block that is unusable). The method continues by detecting each bad physical block. Each bad physical block is then discarded, so as to prevent using the bad physical block for mapping the logical memory space.

A proposed implementation is based on the use of a bad block table (stored in the flash memory) and a corresponding unavailable list (loaded in a working memory).

Moreover, each new bad physical block may be added to the unavailable list during operation of the storage device (in response to a failure of a corresponding erase operation).

Preferably, the bad block table is created when the flash memory is formatted (with each new bad physical block appearing later on that is identified by means of a corresponding flag).

The proposed solution is typically applied when a root physical block and one or more child physical blocks are used for each logical block.

In this case, the number of spare blocks is at least equal to 2.

A recovery procedure is also proposed for reducing the logical memory space when there are too many bad physical blocks.

For this purpose, the (empty) logical blocks to be locked are preferably selected in a portion of the logical memory space that is not used to store meta data.

When the recovery procedure fails, all the logical blocks may be locked in read-only mode.

In an embodiment, a garbage collection procedure is forced when the flash memory leaves a safe status and a current write operation involves an increase of the child physical blocks.

A definition of a corresponding safe condition is also proposed.

In addition, the garbage collection procedure is forced when the flash memory enters a critical status and the current write operation involves an increase of the used (root or child) physical blocks.

A definition of a corresponding critical condition is likewise proposed.

The garbage collection procedure may be forced on a logical block having the minimum number of programmed physical sectors in its child physical block(s).

A particular mapping structure (with a reduced size) is also proposed.

In an implementation of embodiments, the flash memory is of the NAND type.

Another embodiment proposes a method for managing a storage device based on a flash memory. The storage device emulates a logical memory space (including a plurality of logical blocks, each one having a plurality of logical sectors that are adapted to be written repeatedly). The logical memory space is mapped on a physical memory space of the flash memory (including a plurality of physical blocks that are adapted to be erased individually, with each one having a plurality of physical sectors that are adapted to be programmed once). Consecutive versions of the logical sectors of each logical block are stored in succession in the physical sectors of a root physical block and one or more child physical blocks (when the root physical block is full). The method includes defining a mapping structure for mapping each logical sector on an associated physical sector (of a corresponding physical block), which stores the last version of the logical sector. For each written logical block having at least one logical sector that is written, the mapping structure includes a sector map. The sector map has a field for each logical sector of the written logical block. The field stores an indication of the associated physical sector (such as its physical offset in the physical block) when the logical sector is written, or a value equal to the indication of a predefined physical sector of the written logical block (such as the first one) when the logical sector is not written. A further field is used for storing an indication (such as its position in the sector map) of the logical sector being written in the predefined physical sector.

Another embodiment proposes a software program for performing the method.

A further embodiment proposes a control system for a storage device.

A still further embodiment proposes a corresponding storage device.

Moreover, another embodiment proposes a data processing system including one or more storage devices.

BRIEF DESCRIPTION OF THE DRAWINGS

The present disclosure itself, as well as further features and the advantages thereof, will be best understood with reference to the following detailed description of embodiments thereof, given purely by way of a non-restrictive indication, to be read in conjunction with the accompanying drawings, in which:

FIGS. 4A-4G show an exemplary application of a garbage collection procedure according to an embodiment.

DETAILED DESCRIPTION

The following discussion is presented to enable a person skilled in the art to make and use the present disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Figure 1:
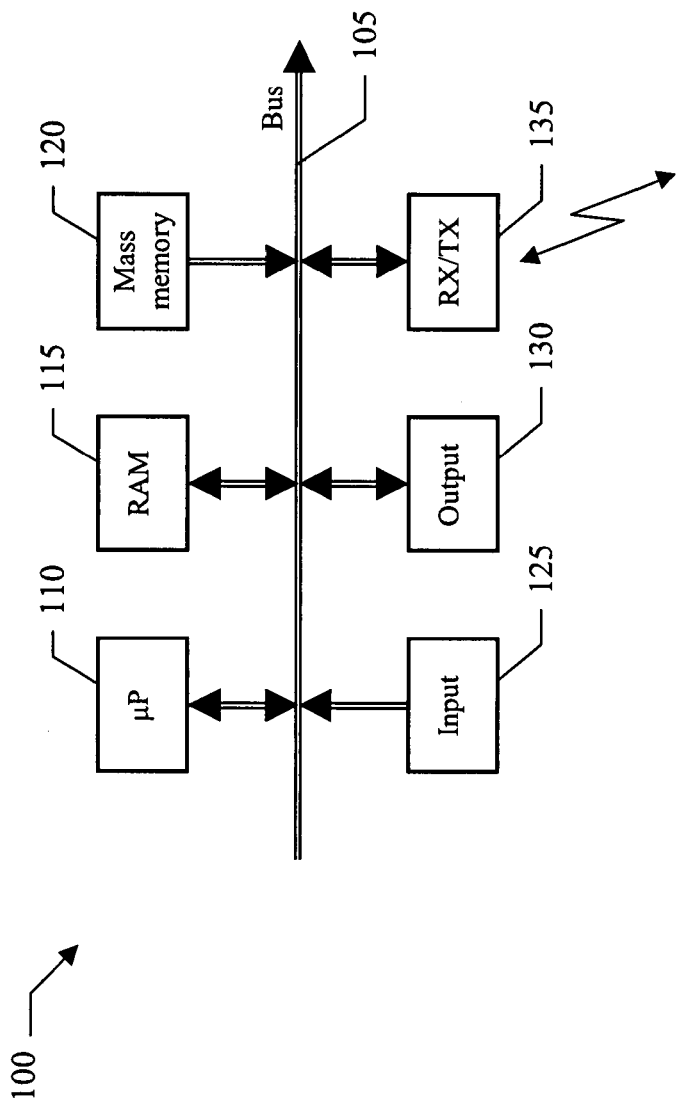
FIG. 1 is a schematic block diagram of a mobile telephone wherein a solution according to an embodiment can be practiced.

With reference now to FIG. 1, a mobile telephone 100 is illustrated. The telephone 100 is formed by several units that are coupled in parallel to a communication bus 105. In detail, a microprocessor (μP) 110 controls operation of the telephone 100. A RAM 115 is directly used as a working memory by the microprocessor 110. Several peripheral units are further coupled to the bus 105 (through respective drives). Particularly, a storage device 120 implements a solid-state mass memory. The storage device 120 is used to store data that should be preserved even when a power supply of the telephone 100 is off (for example, a firmware of the microprocessor 110, application programs, and personal information of a user of the telephone 100—such as an address book). Moreover, the telephone 100 includes input units 125 (for example, a keypad, a microphone, and a camera), and output units 130 (for example, a display and a loudspeaker). A transceiver (RX/TX) 135 implements any communications with a telephone exchange (not shown in the figure) to send and receive information.

Figure 2A:
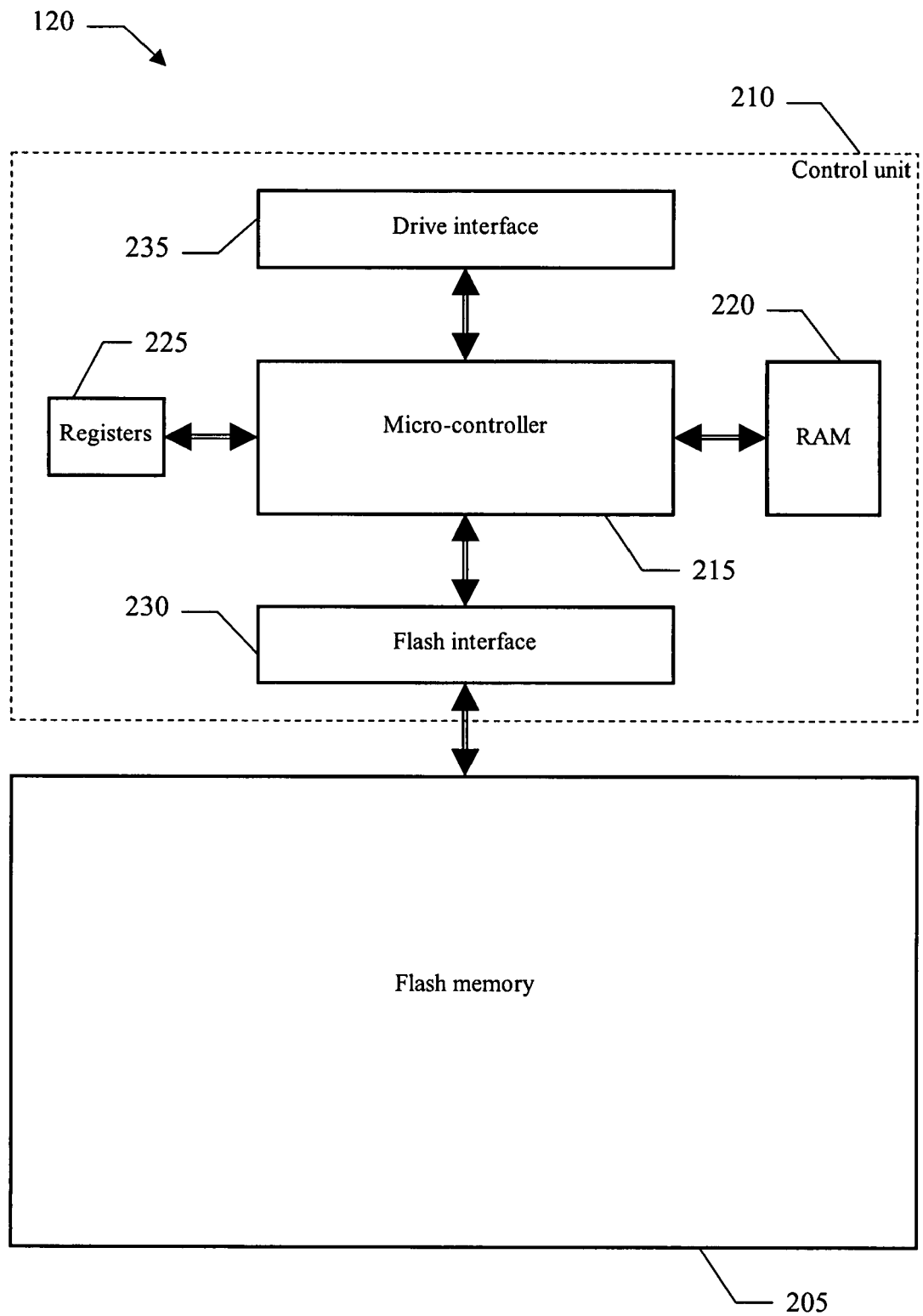
FIG. 2A is a high-level representation of a storage device included in the telephone.

Passing now to FIG. 2A, the storage device 120 is based on a flash memory 205. The flash memory 205 includes a matrix of memory cells with NAND architecture (not shown in the figure). The flash memory 205 programs and reads the memory cells at the level of physical pages (for example, each one consisting of 528 bytes). On the other hand, the memory cells are erased at the level of far larger physical blocks (for example, each one including 256 physical pages). Therefore, once a physical page has been programmed (so as to write the desired data into it), this physical page cannot be updated any longer—unless the whole respective physical block is erased (or the update only involves the programming of its memory cells).

A control unit 210 manages the flash memory 205 so as to emulate a random access to the storage device 120. The control unit 210 is based on a micro-controller 215. The micro-controller 215 accesses a RAM 220 (being used as a working memory) and a series of registers 225. An interface 230 couples the micro-controller 215 with the flash memory 205; another interface 235 instead couples the same micro-controller 215 with the drive of the telephone for the storage device 120 (not shown in the figure).

Operation of the micro-controlled 215 is managed by firmware, which is stored in the flash memory 205 and then loaded (at least partially) into the RAM 220 when the micro-controller 215 is running; the firmware is initially installed onto the flash memory 205 during a manufacturing process of the storage device.

Figure 2B:
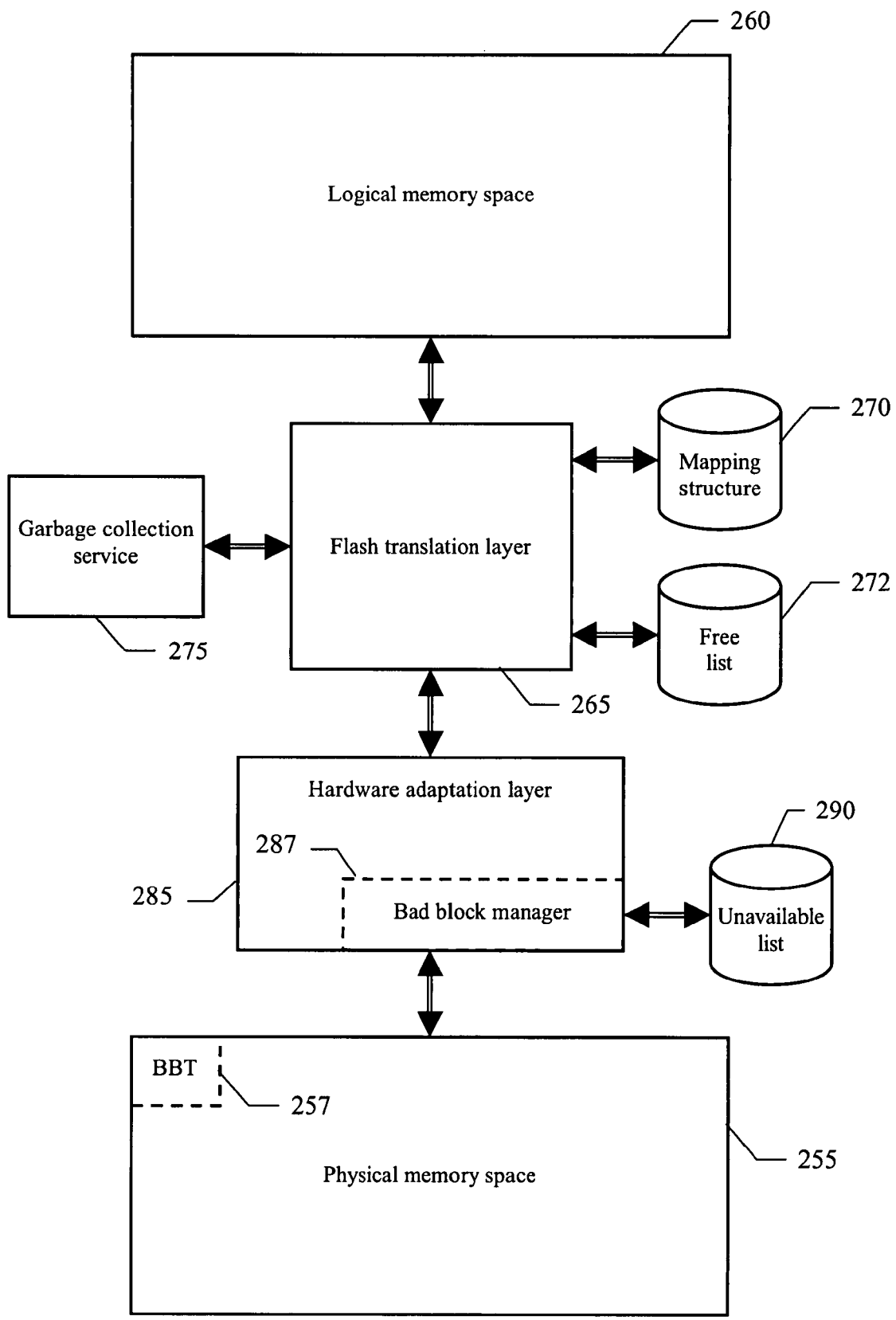
FIG. 2B is a functional scheme of the storage device.

A functional scheme of the same storage device is illustrated in FIG. 2B. The flash memory provides a physical memory space 255. The physical memory space 255 consists of its physical blocks, which can be erased individually. Each physical block is identified by a corresponding physical block number (for example, of 12 bits for accessing up to 4096 physical blocks). In turn, each physical block includes its physical pages, which can be programmed (only once for each memory cell) and read individually. Each physical page is identified by a corresponding physical offset within the physical block (of 8 bits in the example at issue, wherein each physical block includes 256 physical pages).

The storage device 120 emulates a logical memory space 260. The logical memory space 260 consists of logical sectors (for example, each one of 512 bytes), which can be written (repeatedly to any value) and read individually. The logical sectors are grouped into logical blocks (for example, each one including 256 logical sectors). Each logical block is identified by a corresponding logical block number (for example, again of 12 bits for accessing up to 4096 logical blocks). Each logical sector is identified by a corresponding logical offset within the logical block (of 8 bits in the example at issue). The different versions of the logical sectors are written into corresponding physical sectors (each one typically consisting of a single physical page). The physical sector includes a main area for storing the value of the logical sector and a spare area for storing service information (i.e., 512 bytes and 16 bytes, respectively, in the example at issue).

The logical memory space 260 consists of a predefined number NL of logical blocks (for example, NL=4096 for a logical memory space 260 of 4096·256·512=512 Mbytes). In an embodiment, as described in detail in the following, the physical memory space 255 consists of a higher number NP of physical blocks. The number of physical blocks NP is equal to the number of logical blocks NL plus a number NS of spare blocks. The spare blocks NS consist of additional physical blocks that are available to replace any physical block that is bad. However, unlike the (static) bad block management techniques that have been proposed in the past, the spare blocks are not distinct from the other physical blocks (and they are not necessarily all good). In other words, the whole physical memory space 255—including the spare blocks as well, being indistinguishable from the other physical blocks—is used to map the logical memory space 260 (with the bad physical blocks that are managed dynamically within it).

The proposed solution reduces any waste of area of the flash memory for implementing the spare blocks. Indeed, no physical blocks are now reserved for use as spare blocks (with the whole physical memory space that is instead used to map the logical memory space). This allows increasing the number of spare blocks, and then the capability of ensuring the correct operation of the flash memory even with a high number of bad physical blocks.

Moreover, every operation may now be performed directly on each physical block—without any search for determining whether it must be replaced with a corresponding spare block. This has a beneficial impact on the access time of the storage device (especially when its flash memory has a large size).

In an embodiment, one of the physical blocks is dedicated to store a Bad Block Table (BBT) 257. For example, the bad block table 257 is stored in the first physical block of the physical memory space 255 that is good. For each physical block, the bad block table 257 stores a bad flag that is asserted when the physical block is bad (while it is deasserted otherwise). Therefore, in the example at issue (wherein the physical memory space 255 may include up to 4096 physical blocks and each physical sector has a main area of 512 bytes), the bad block table 257 is stored in 4096/512=8 physical sectors of the corresponding physical block. Each physical sector used to store the bad block table 257 is identified by means of a corresponding table flag, which is written in its spare area. Typically, the table flag consists of a specific bit that is asserted for the physical sectors storing the bad block table 257 (while it is deasserted for the other physical sectors). In this way, the table flag of the first physical sector of the different physical blocks may also be used to identify the one storing the bad block table 257 (when it is asserted). The bad block table 257 is written into the flash memory every time it is formatted, by erasing all its physical blocks (and it remains unchanged until the next format operation).

Typically, the mapping of the logical memory space 260 on the physical memory space 255 is implemented by a Flash Translation Layer (FTL) 265. Particularly, each logical block is associated with one or more physical blocks (organized into a tree structure). In a specific implementation, the logical block is associated with a physical block that defines a root node, and possibly with another physical block that defines a leaf node (depending on the root node). The logical sectors of the logical block are written in succession into consecutive physical sectors of the associated physical block(s). The writing of the logical sectors starts from the root physical block, and then continues to the leaf physical block once the root physical block is full. Since the physical sectors can be programmed only once, any time a logical sector must be updated its new version is written into another physical sector. When a logical sector is written into a physical sector, its value is stored in the main area of the physical sector. The spare area instead stores an indication of the corresponding logical sector (for example, its logical offset). The spare area of the first physical sector of each physical block is also used to store an indication of the corresponding logical block (for example, its logical block number), and an indication of the position of the physical block in the tree structure (i.e., root node or leaf node).

For this purpose, the translation layer 265 manages a Logical-to-Physical (L2P) mapping structure 270. As described in detail in the following, the mapping structure 270 associates each logical block with its root physical block and leaf physical block (if any). In turn, the mapping structure 270 associates each written logical sector with the physical sector (in the root physical block or in the leaf physical block) wherein its last version is stored. The mapping structure 270 is created—at least partially—during an initialization of the storage device at its power-on (by reading the relevant information stored in the spare areas of the different physical sectors). The mapping structure 270 is then maintained up-to-date according to the operations performed on the storage device.

The translation layer 265 also manages a free list 272. The free list 272 indicates the physical blocks that are erased and then available to write data (by means of their physical block numbers). Preferably, the erased physical blocks are arranged in the free list 272 in increasing order of their number of erasures. This information is used by the translation layer 265 to implement a wear leveling algorithm, which is aimed at distributing the number of erasures of the physical blocks uniformly throughout the whole flash memory (as described in the co-pending patent application entitled WEAR LEVELING IN STORAGE DEVICES BASED ON FLASH MEMORIES AND RELATED CIRCUIT, SYSTEM, AND METHOD Ser. No. 12/075,991, the entire disclosure of which is herein incorporated by reference to the maximum extent allowable by law). The free list 272 is created at the initialization of the storage device by reading an Aging Block Table (ABT), not shown in the figure. The aging block table (for example, stored in the last physical block of the physical memory space 255 that is good) includes an indication of the number of erasures of each physical block. The free list 272 is then maintained up-to-date according to the operations performed on the storage device.

The translation layer 265 also interfaces with a service 275 that implements a garbage collection procedure. When the garbage collection service 275 is invoked for a specific logical block, its (old) root and leaf physical blocks are compacted into a new root physical block. The old root and leaf physical blocks are then erased. Typically, a (natural) garbage collection procedure is performed whenever a write operation is required on a logical block having both the root and leaf physical blocks associated with it that are full (so that the desired write operation would not be possible). Preferably, in this case any previous version of the logical sector to be written is not copied into the new root physical block (since it would be useless).

The translation layer 265 controls the physical memory space 255 through a hardware adaptation layer 285. The adaptation layer 285 exports a command interface for reading/programming the physical pages and for erasing the physical blocks of the flash memory. The adaptation layer 285 implements different functions that are required to access the flash memory (such as a low level driver of the flash memory, an ECC manager, and the like). Particularly, the adaptation layer 285 includes a bad block manager 287, which is aimed at making any bad physical block opaque to the flash translation layer 265. For this purpose, the bad block manager 287 controls an unavailable list 290, which stores an indication of the physical blocks that are currently bad (by means of their physical block numbers). The unavailable list 290 is created at the initialization of the storage device. In this phase, the unavailable list 290 is populated with the bad physical blocks indicated in the bad block table 257 (i.e., that became bad during the format operation). The unavailable list 290 is further populated with any other bad physical block that became bad after the format operation, as indicated by a bad block flag in the spare area of its first physical sector being asserted. During operation of the storage device, the unavailable list 290 is then updated by adding any physical block that becomes bad because its erasure fails. Conversely, when the programming of a physical sector fails, the same operation is attempted again on a next physical sector without any effect on the status of the corresponding physical block (which will become bad at its next erasure). The unavailable list 290 facilitates the management of the bad physical blocks. Indeed, the required information is now available directly in the working memory of the control unit, thereby reducing the (slow) accesses to the flash memory.

Moving now to FIGS. 3A-3C, when the storage device implements the above-described root-leaf mapping technique, its correct operation requires that the number of spare blocks NS should be at least 2 (for the sake of simplicity, in the following the additional physical blocks required for service information—such as the two physical blocks for storing the bad block table and the aging block table—will be disregarded). Indeed, let us assume that only a single leaf physical block may be present at the time. In this case, once all the logical blocks are written into corresponding root physical blocks (equal to the number of logical blocks NL), one more physical block is required for storing the leaf physical block. Moreover, another physical block is required to perform a garbage collection procedure when a write operation involves the generation of another leaf physical block.

Figure 3A:
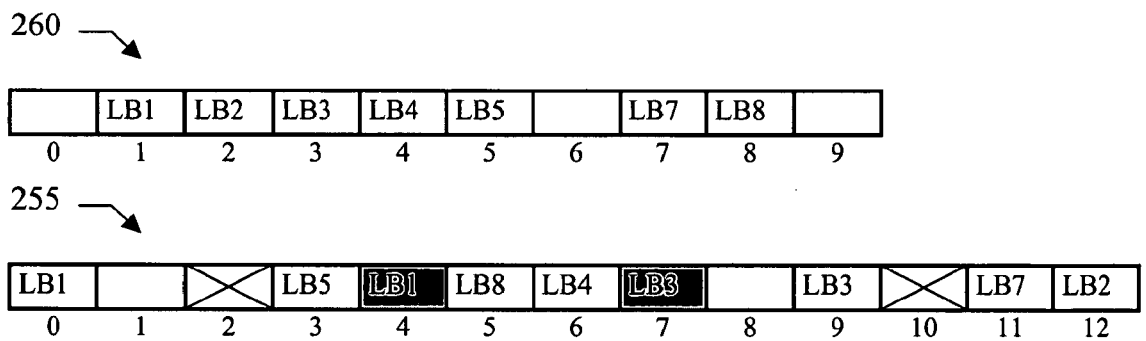
FIGS. 3A-3C show an exemplary application of a recovery procedure according to an embodiment.

However, as shown in FIG. 3A, any bad physical blocks are now included in the physical memory space 255 that is used to map the logical memory space 260. Therefore, the same constraint should be satisfied also taking into account a number NB of the bad physical blocks that are currently present, as defined by the following correctness condition to be satisfied:

$$NS-NB>=2.$$

Typically, the number of spare blocks NS is chosen far higher than 2. Suggested values of the number of spare blocks NS are 2%-20% of the number of logical blocks NL, and preferably 5%-15% (such as 10%). Therefore, in the example at issue (wherein the number of logical sectors NL is 4096), the number of spare blocks NS may be set to 4096·10/100=409. In this way, it is possible to ensure the correct operation of the storage device even when a relatively high number of bad physical blocks appear. Moreover, the storage device now allows having more leaf physical blocks at the same time. This reduces the frequency of the garbage collection procedure, with a corresponding improvement in the performance of the storage device.

When the above-mentioned correctness condition is not satisfied, the storage device cannot support its full logical memory space any longer. For example, as shown in the figure, let us consider a very simplified scenario wherein the logical memory space 260 only includes NL=10 logical blocks (identified by their logical block numbers from LB=0 to LB=9). Each logical block being written (i.e., including one or more written logical sectors) is indicated by means of a corresponding reference LBi (with i=0 . . . 9), while the empty logical blocks (i.e., with all the logical sectors that are not written) are left unfilled. The physical memory space 255 being used to map the logical memory space 260 includes NP=13 physical blocks (i.e., it has NS=NP−NL=13−10=3 spare blocks), identified by their physical block numbers from PB=0 to PB=12. The physical blocks that are currently used to store the logical blocks are indicated by means of the corresponding references LB0-LB9—with a white background for the root physical blocks and a gray background for the leaf physical blocks. The erased physical blocks are instead left unfilled. The bad physical blocks are denoted by means of a cross. In the example at issue, the logical blocks LB=1-LB=5 and LB=7-LB=8 are written, while the logical blocks LB=0, LB=6 and LB=9 are empty. For this purpose, the (root) physical blocks PB=12, PB=6, PB=3, PB=11 and PB=5 are used to store the logical blocks LB2, LB4, LB5, LB7 and LB8, respectively. The logical block LB1 is stored in the (root) physical block PB=0 and the (leaf) physical block PB=4, while the logical block LB3 is stored in the (root)

physical block PB=9 and the (leaf) physical block PB=7. The physical blocks PB=1 and PB=8 are erased, whereas the physical blocks PB=2 and PB=10 are bad. In this case, the correctness condition is not satisfied, since NS−NB=3−2=1 (not >=2). Therefore, it would not be possible to write all the NL=10 logical blocks with the remaining (good) physical blocks NP−NB=13−2=11 (neither with a single leaf physical block at the time).

In the solution according to an embodiment, when this happens a recovery procedure is performed (in an attempt to restore the correct operation of the storage device). For this purpose, the garbage collection procedure is forced on every logical block that is stored in a pair of (root and leaf) physical blocks—being always possible when the garbage collection procedure is forced as described in the following. As a result, each pair of root and leaf physical blocks are compacted into a new root physical block, and their erasure is then attempted. Every erase operation that succeeds generates a corresponding erased physical block, whereas every erase operation that fails generates a corresponding bad physical block. At this point, there is verified whether the empty logical blocks are enough to allow reducing the logical memory space 260 (i.e., increasing the number of spare blocks NS accordingly), so as to satisfy the correctness condition. Denoting with NE the number of the empty logical blocks, this means that the following recovery condition should be satisfied:

$$(NS+NE)-NB>=2,$$

that is:

$$NE>=2-NS+NB.$$

If so, the minimum number of empty logical blocks required to satisfy the recovery condition (i.e., NK=2−NS+NB) is locked, so that is not possible to use them. In other words, the number of logical blocks that are now available (differentiated with a prime notation) is:

$$NL'=NL-NK.$$

Therefore, the actual number of spare blocks (differentiated with a prime notation as well) becomes:

$$NS'=NP-NU=NP-NL+NK=NS+NK.$$

In this way, the logical memory space 260 is reduced by the number of locked logical blocks NK. However, this allows restoring its correct operation, with the correctness condition that is again satisfied:

$$NS'-NB=NS+NK-NB=NS+2-NS+NB-NB=2(>=2).$$

Conversely (when NE<2−NS+NB), the recovery procedure fails. In this case, the whole logical memory space 260 is locked so as to prevent any further writing of its logical blocks (which cannot be ensured any longer). However, the storage device continues working in a read-only mode, so that the stored data can be saved onto another medium. It is then possible to format the storage device (with the logical memory space 260 that is reduced accordingly) and then recover the saved data (at least partially).

The proposed feature makes it possible to continue using the storage device with a graceful degradation of its performance, even when the number of bad physical blocks increases excessively.

Preferably, the logical blocks to be locked are selected according to the usage of the logical memory space 260 by a file system of the mobile telephone (including in its operating system). Typically, the file system stores payload data (consisting of actual data of interest) and corresponding meta data (being used to describe the payload data). For example, the meta data is used to define a directory organization, to store attributes of its files (such as a type, a protection mode, a time-stamp), and the like. Most of the file systems store the meta data into a specific portion of the logical memory space. For example, the meta data is stored at the beginning of the logical memory space 260 (i.e., starting from the first logical block LB=0). In this case, the logical blocks to be locked are selected in the other portion of the logical memory space 260 that is not used for the meta data. In the example at issue, the logical blocks to be locked are then selected at the end of the logical memory space 260 (i.e., starting from the last logical block LB=NL−1). This choice avoids any problem for the file system, which may be caused by the unavailability of some logical blocks for storing the meta data.

Figure 3B:
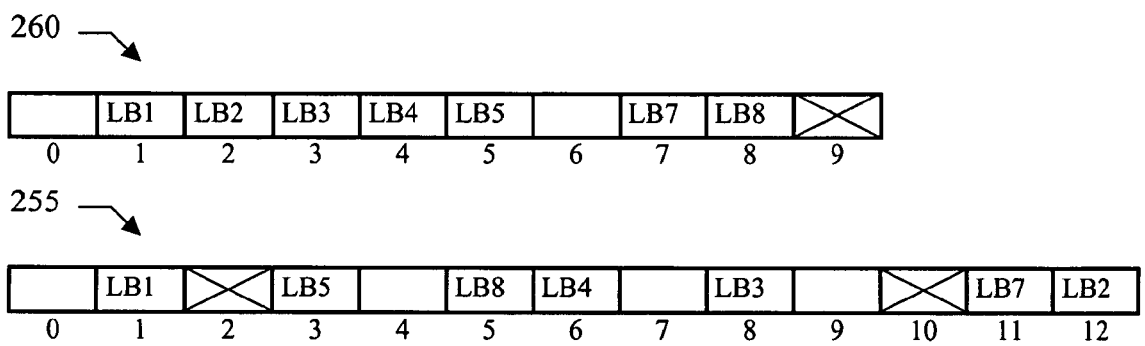

In the example at issue, as shown in FIG. 3B, the old root physical block PB=0 and the old leaf physical block PB=4 (used to store the logical block LB1) are compacted into the new root physical block PB=1, while the old root physical block PB=9 and the old leaf physical block PB=7 (storing the logical block LB3) are compacted into the new root physical block PB=8. All the old physical blocks PB=0, PB=4, PB=7 and PB=9 are then erased successfully. In this case, the recovery condition is satisfied, since the number of empty logical blocks NE=3 is at least equal to 2−NS+NB=2−3+2=1. Therefore, it is possible to lock NK=1 empty logical block so as to restore the correct operation of the storage device. The empty logical block to be locked is selected starting from the end of the logical memory space 260. In the example, at issue, the selected empty logical block will consist of the logical block LB=9 (as indicated by means of a cross in the figure). In this way, the logical memory space 260 is reduced to NL'=NL−NK=10−1=9 logical blocks, with the number of spare blocks NS'=NS+NK=3+1=4 that is increased accordingly. Therefore, the correctness condition is again satisfied, since NS'−NB=4−2=2 (>=2).

Figure 3C:
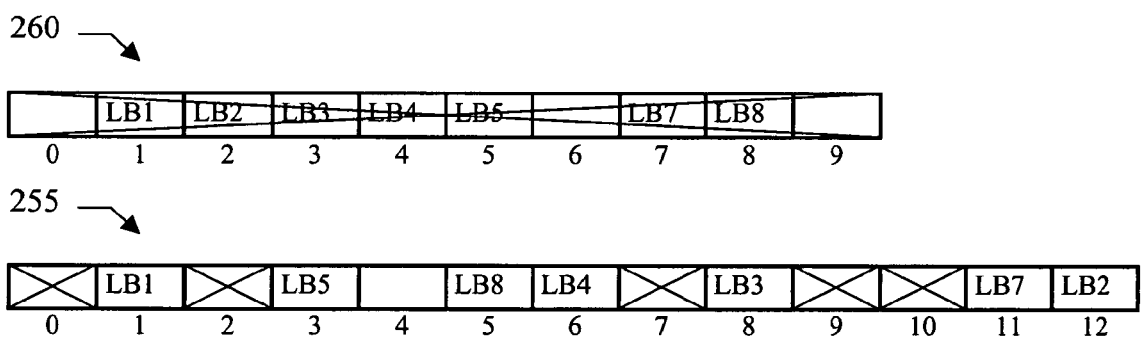

Considering instead FIG. 3C, during the above-described garbage collection procedures only the old physical block PB=4 is erased. Conversely, the erasures of the old physical blocks PB=0, PB=7 and PB=9 fail, so that they become bad. In this case, the recovery condition is not satisfied, since the number of empty logical blocks NE=3 is lower than the required value of 2−NS+NB=2−3+5=4 (so that their locking would not be enough to restore the correct operation of the storage device). Therefore, all the logical blocks LB=1-LB=9 are locked (as indicated by a corresponding global cross), so as to make the whole logical memory space 260 read-only (until its next format operation).

With reference now to FIGS. 4A-4G, in the solution according to an embodiment the storage device also implements a (forced) garbage collection procedure to ensure the full accessibility to the logical memory space 260. Preferably, this garbage collection procedure should be performed while the storage device is idle. However, in some cases this is not sufficient. Moreover, some telephones do not support the possibility of invoking the garbage collection procedure during an idle thread of their operating system. This requires the necessity of performing the garbage collection procedure during operation of the storage device (i.e., during a write operation).

In detail, the flash memory is in a safe status until the leaf physical blocks plus 1 do not exceed the spare blocks actually available (taking into account any bad physical blocks). Indeed, in this case the physical blocks are enough to store all the logical blocks (with the leaf physical blocks being present at the moment), and at the same time to perform at least one garbage collection procedure. This is possible without requiring any further garbage collection procedure to erase more physical blocks—and then irrespectively of the failure of the corresponding erase operations. Denoting with NU a number of the used physical blocks and with NW a number of the written logical blocks, the number of leaf physical blocks is equal to NU−NW. Therefore, the flash memory is in the safe status when the following safe condition is satisfied:

$$NU-NW+1 <= F-B$$

where "F" denotes the number of "free" physical blocks and "B" denotes the number of "bad" physical blocks.

However, the flash memory can continue working even after leaving the safe status (when the safe condition is not satisfied any longer), even if in this case the correct operation of the storage device cannot be always ensured (should a high number of erase operations fail). Indeed, the garbage collection procedure might be delayed until the flash memory enters a critical status, wherein only one garbage collection procedure can be performed. This happens when a single physical block is erased—i.e., the following critical condition is satisfied:

$$NU+NB=NP-1.$$

In an embodiment, the garbage collection procedure is performed after leaving the safe status (safe condition not satisfied) whenever the leaf physical blocks increase. In other words, the garbage collection procedure is performed whenever a write operation is required on a logical block having the associated root physical block that is full (new leaf physical block). Once the flash memory entered the critical status (critical condition satisfied), instead, the garbage collection procedure is performed whenever the used (root or leaf) physical blocks increase. In other words, the garbage collection procedure is performed when a write operation is required on a logical block having the associated root physical block that is full (new leaf physical block) or on a logical block being empty (new root physical block). It should be noted that at least one pair of root/leaf physical blocks always exists in both cases, assuming that the correctness condition is satisfied.

In this way, the number of leaf physical blocks does not increase any longer once the flash memory has left the safe status. Therefore, when the flash memory enters the critical status the logical memory space 260 will be exploited at its best, with almost all the logical blocks being written (unless the physical memory space includes many bad physical blocks). In this way, the risk of having the flash memory locked because the correctness condition is not satisfied (when the garbage collection procedure in the critical condition is unable to erase any physical block—i.e., the erasures of both the old root and leaf physical blocks fail) only occurs when the whole logical memory space 260 (or at least most of it) has been filled. This avoids degrading the performance of the storage device when many leaf physical blocks are present, with only half the logical memory space 260 that is exploited in the worst condition—when each logical block is stored in a pair of (root and leaf) physical blocks. Moreover, in the critical status the garbage collection procedure is performed only when it is strictly necessary (to maintain one erased physical block). In any case, the overhead on any write operation is at most equal to the time required to perform a single garbage collection procedure. This maintains the overhead acceptable in every operative condition. As a result, the performance of the storage device is substantially uniform (without degrading after any fixed point).

As a further improvement, the logical block on which the garbage collection procedure should be performed is selected so as to minimize its execution time. For this purpose, the leaf physical block having the minimum number of physical sectors that are programmed is determined. The logical block associated with this leaf physical block is then selected for the garbage collection procedure. This choice ensures that the number of last versions of the logical sectors to be copied into the new root physical block is reduced. As a result, it is possible to minimize the negative impact of the garbage collection procedure on the corresponding write operation.

Figure 4A:
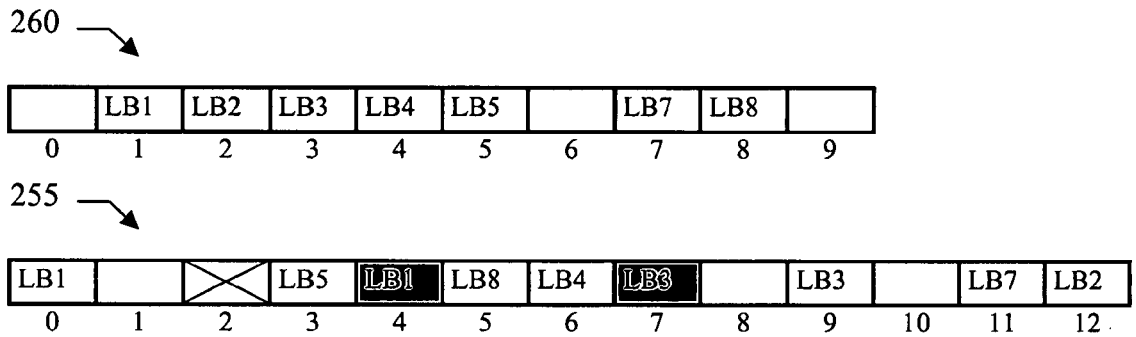

For example, FIG. 4A shows a scenario (again with the logical memory space 260 including NL=10 logical blocks and with the physical memory space 255 including NP=13 physical blocks, i.e., having NS=3 spare blocks) wherein the flash memory has just left the safe status but it has not entered yet the critical status. The logical blocks LB=1, LB=2, LB=3, LB=4, LB=5, LB=7 and LB=8 are written in the physical blocks PB=0 (root) and PB=4 (leaf), PB=12 (root), PB=9 (root) and PB=7 (leaf), PB=6 (root), PB=3 (root), PB=11 (root) and PB=5 (root), respectively, while the logical blocks LB=0, LB=6 and LB=9 are empty. The physical blocks PB=1, PB=8 and PB=10 are erased, whereas the physical block PB=2 is bad. In this case, the safe condition is not satisfied, since NU−NW+1=9−7+1=3 is higher than F−B=3−1=2; therefore, it would not be possible to ensure the capability of writing the remaining empty logical blocks (LB=0, LB=6, and LB=9) and performing at least one garbage collection procedure with the remaining 3 erased physical blocks in any condition. Conversely, the critical condition is not satisfied, since NU+NB=9+1=10 is lower than NP−1=13−1=12.

Figure 4B:
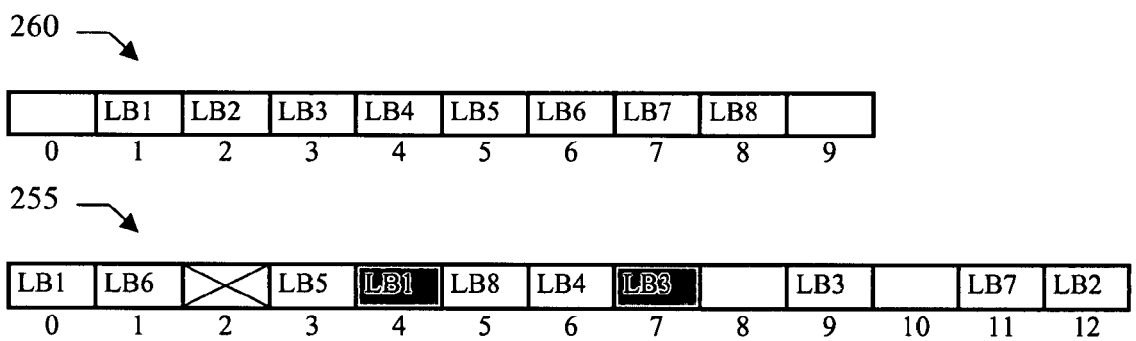

Moving to FIG. 4B, let us assume now that a write operation on the logical block LB=6 must be performed. Since the logical block LB=6 is empty, this involves using an erased physical block (such as PB=1) for its new root physical block. The write operation does not involve any increase of the number of leaf physical blocks (again equal to 2), so that no garbage collection procedure is performed. In this case, the critical condition remains not satisfied, since NU+NB=10+1=11 is again lower than NP−1=12.

Figure 4C:
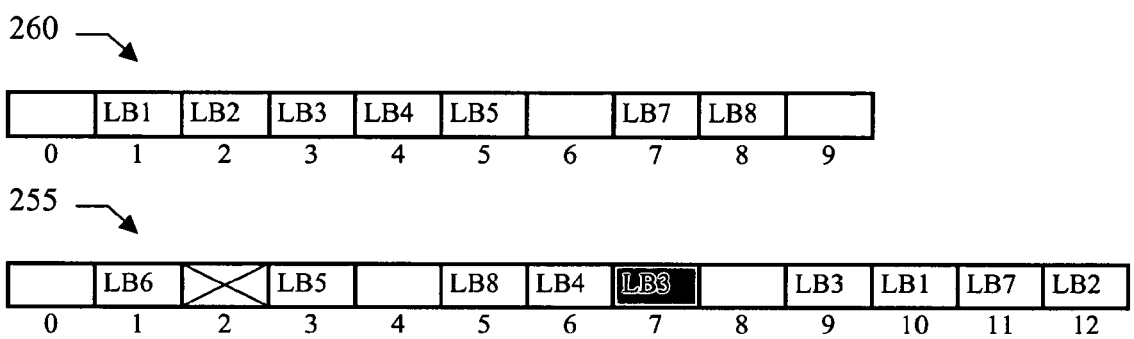

Conversely, when a write operation must be performed on the logical block LB=7, this increases the number of the leaf physical blocks—assuming that the corresponding root physical block (PB=11) is full. Therefore, in this case a garbage collection procedure is performed. In the example at issue, as shown in FIG. 4C, for this purpose the logical block LB1 is selected—assuming that its leaf physical block (PB=4) includes a number of programmed physical sectors lower than the one of the other leaf physical blocks (i.e., PB=7). As a result, an erased physical block (such as PB=10) is used for its new root physical block (wherein the logical block LB1 is compacted). The old root (PB=0) and leaf (PB=4) physical blocks associated therewith are then erased successfully.

Figure 4D:
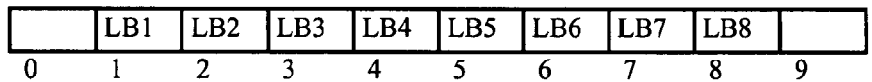
Figure 4D:
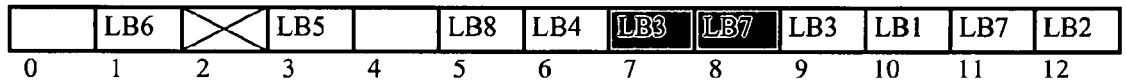

With reference now to FIG. 4D, the desired write operation on the logical block LB7 is performed; this involves the use of an erased physical block (such as PB=8) for its new leaf physical block. As above, the critical condition remains not satisfied, since NU+NB=10+1=11 is again lower than NP−1=12.

Figure 4E:
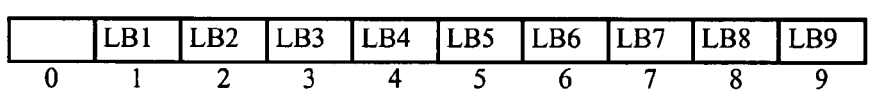
Figure 4E:
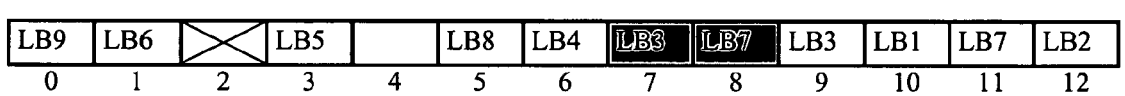

Moving to FIG. 4E, a write operation on the logical block LB9 must now be performed. Since the logical block LB9 is empty, this involves using an erased physical block (such as PB=0) for its new root physical block. The write operation does not involve any increase of the number of leaf physical blocks (again equal to 2), so that no garbage collection procedure is performed. In this case, however, the critical condition becomes satisfied, since NU+NB=11+1=12 is now equal to NP−1=12.

Figure 4F:
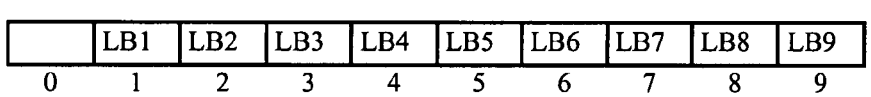
Figure 4F:
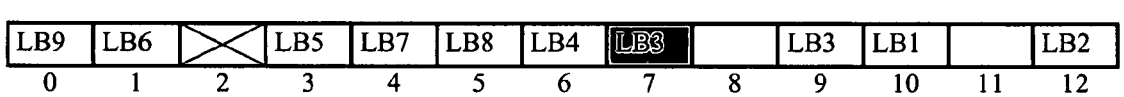

Let us assume now that a write operation must be performed on the logical block LB0. Since the logical block LB0 is empty, the write operation increases the number of used physical blocks (for its new root physical block). Therefore, in this case a garbage collection procedure is performed. In the example at issue, as shown in FIG. 4F, for this purpose the logical block LB7 is selected—assuming that its leaf physical block (PB=8) includes a number of programmed physical sectors lower than the one of the other leaf physical blocks (i.e., PB=7). As a result, an erased physical block (such as PB=4) is used for its new root physical block (wherein the logical block LB7 is compacted). The old root (PB=11) and leaf (PB=8) physical blocks associated therewith are then erased successfully.

With reference to FIG. 4G, the desired write operation on the logical block LB0 is performed. This involves the use of an erased physical block (such as PB=11) for its new root physical block—with the critical condition that remains satisfied, since NU+NB=11+1=12 is again equal to NP−1=12.

Figure 5A:
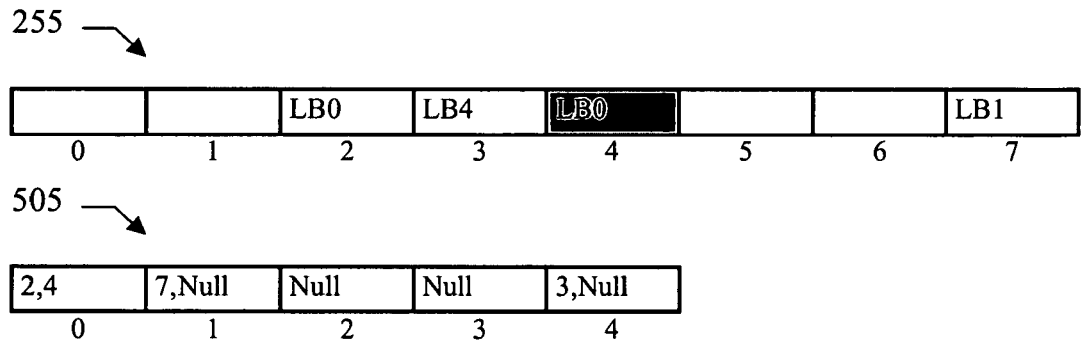
FIGS. 5A-5C show a mapping structure according to an embodiment.
Figure 5B:
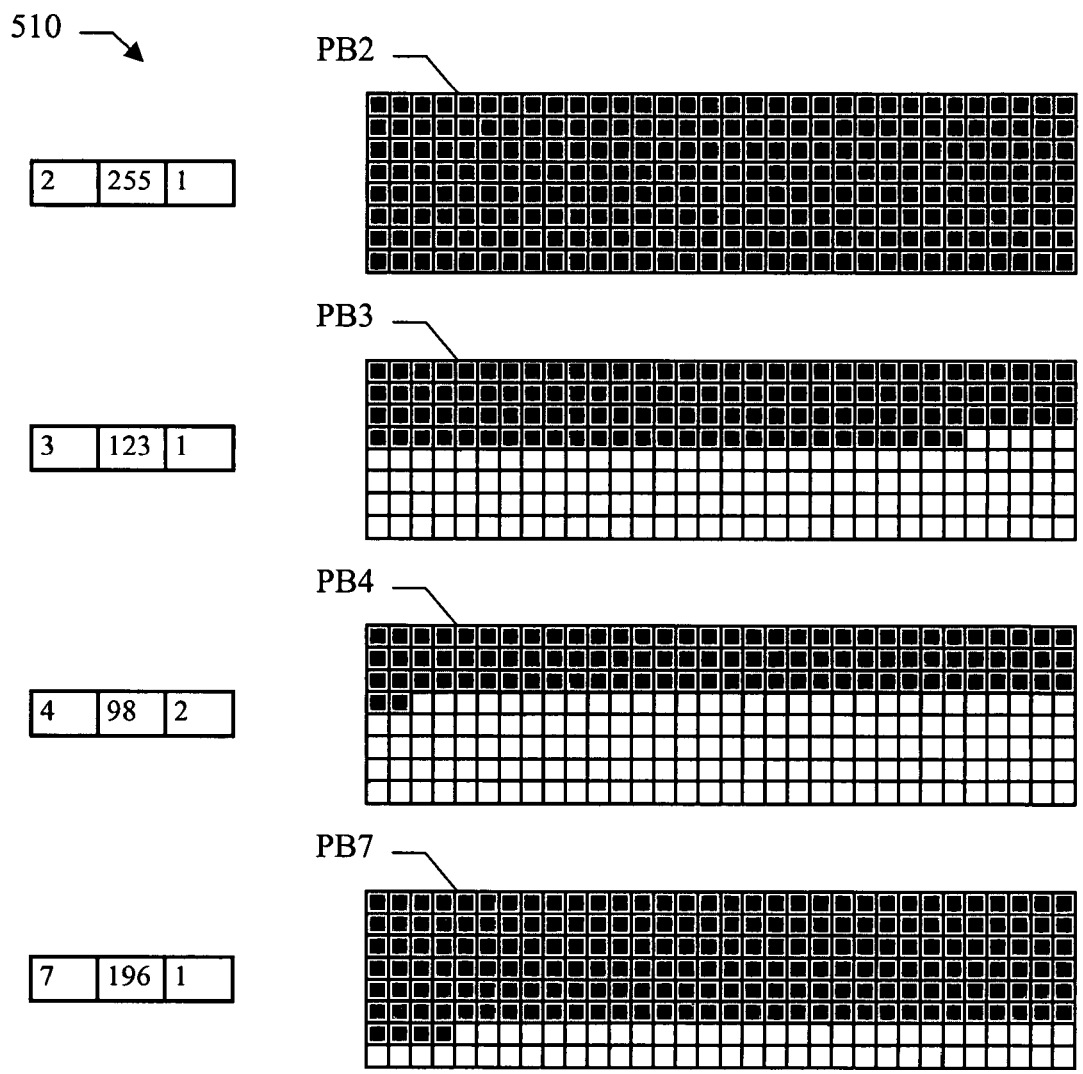
Figure 5C:
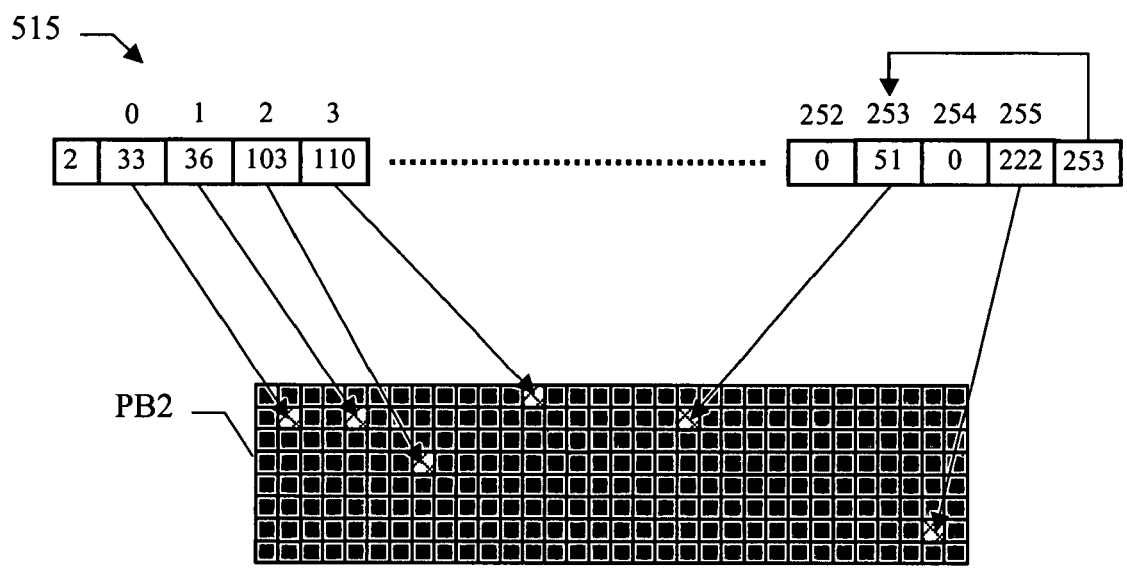
Figure 5C:
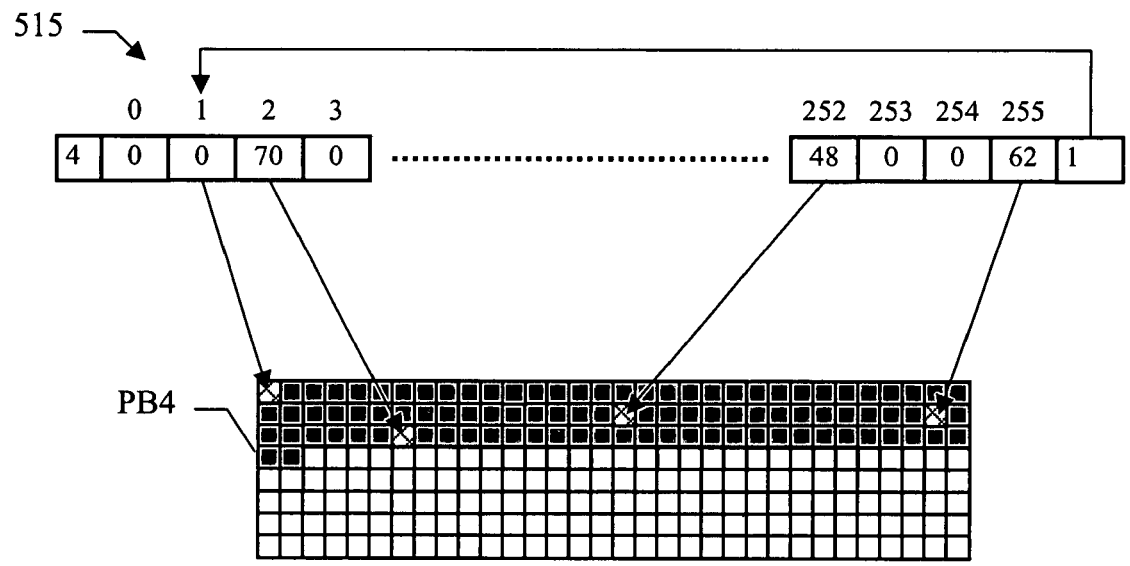
Figure 6A:
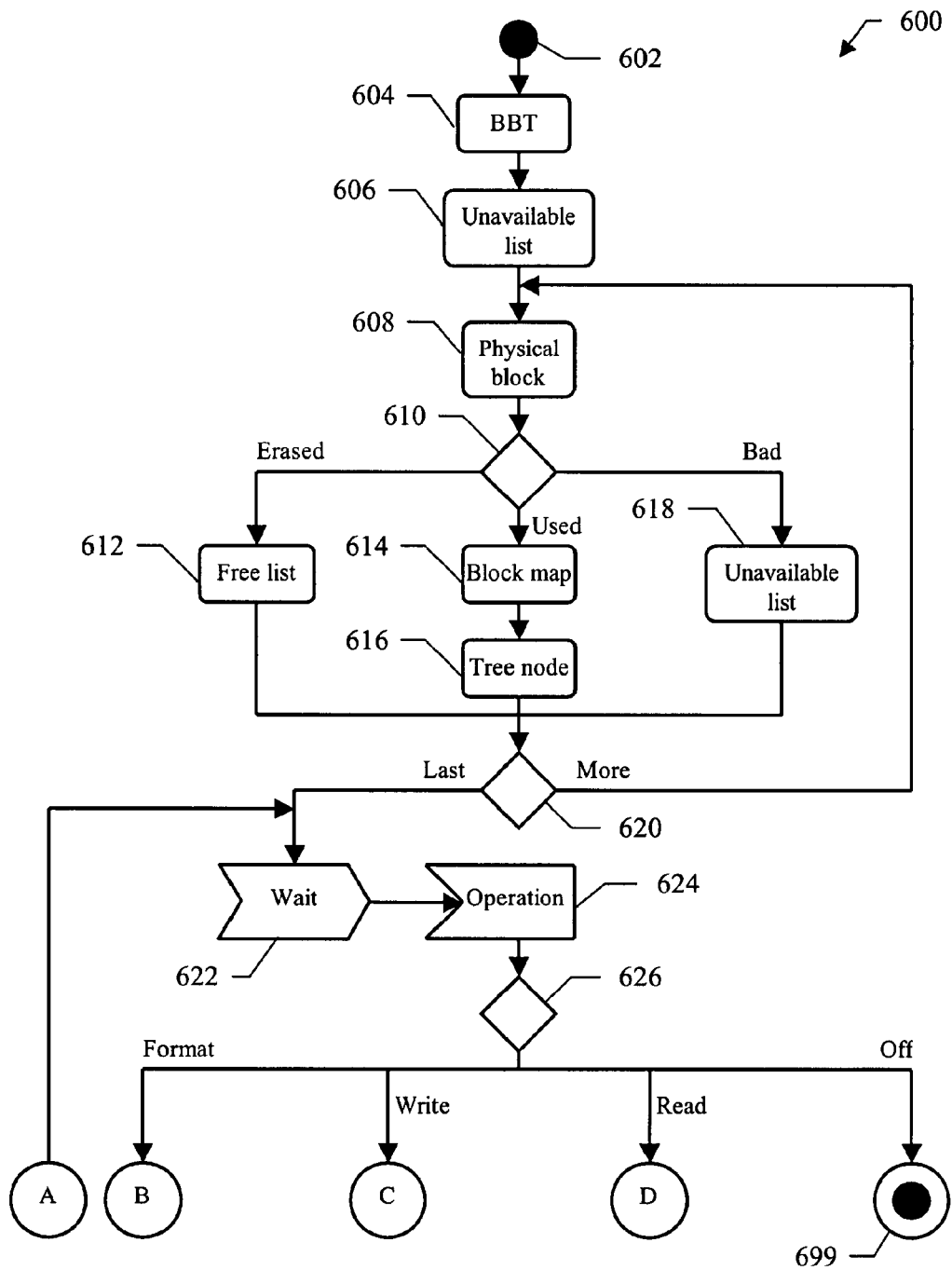
FIGS. 6A-6D show a diagram describing the flow of activities relating to an implementation of a solution according to an embodiment.
Figure 6B:
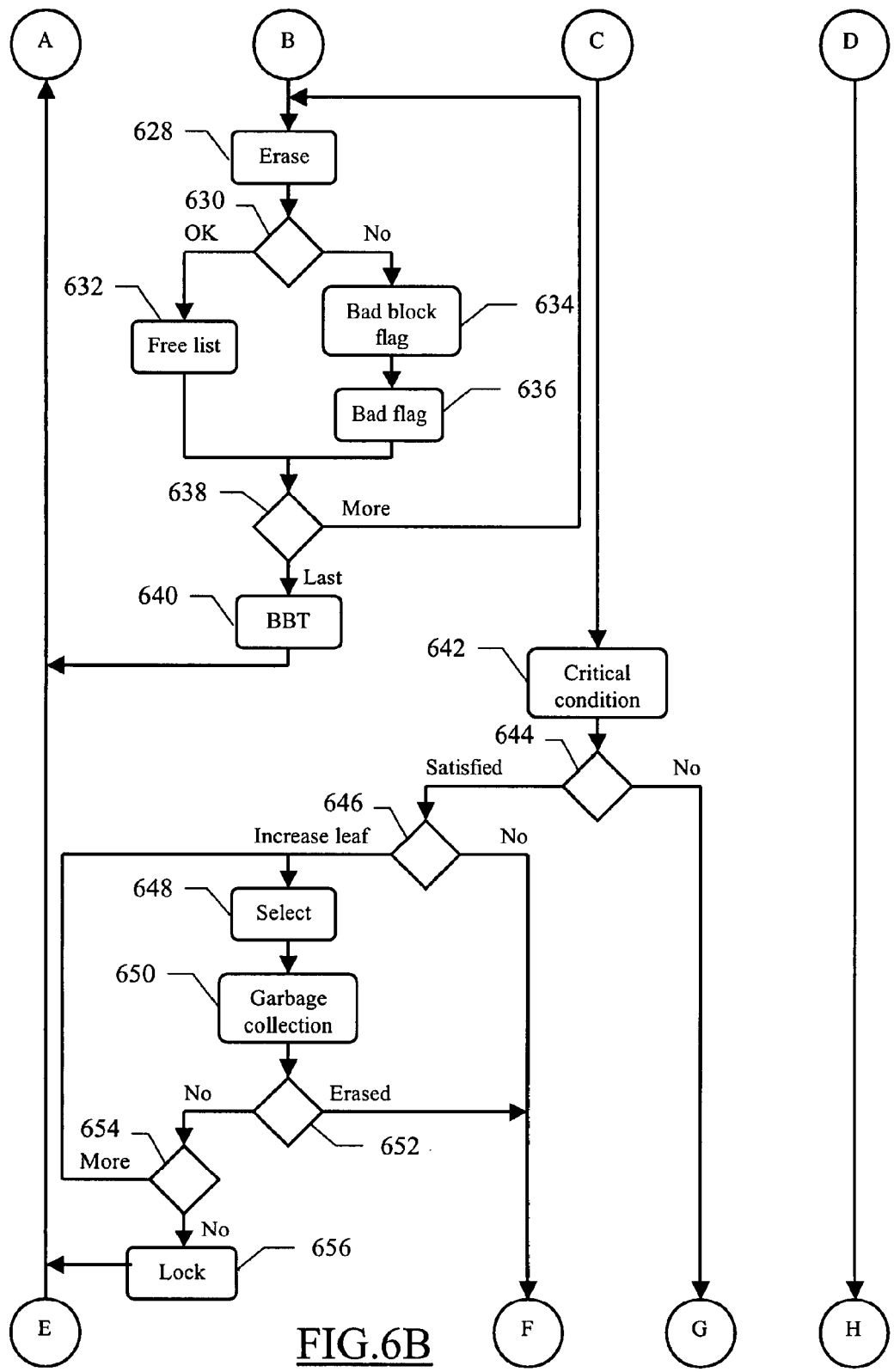
Figure 6C:
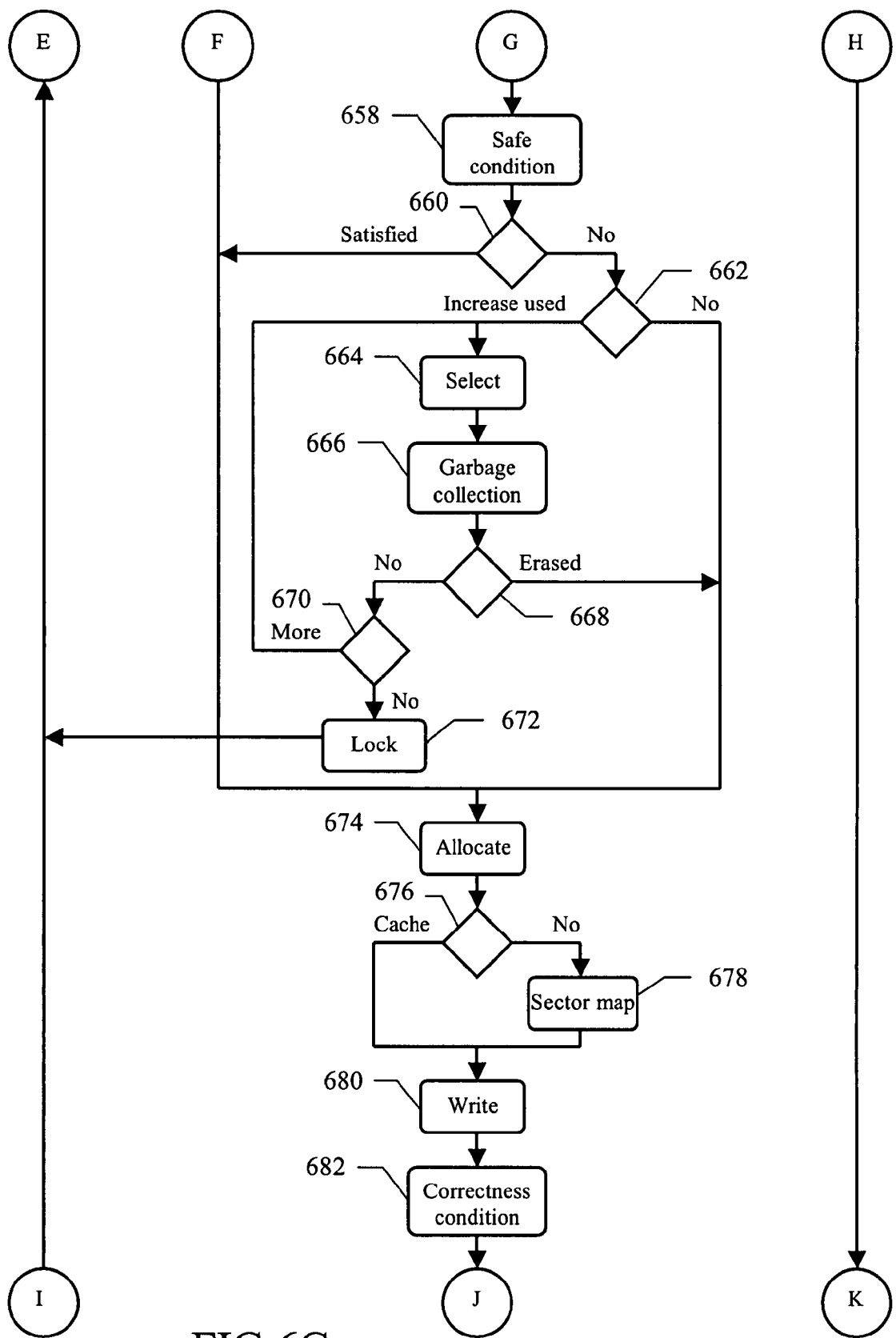
Figure 6D:
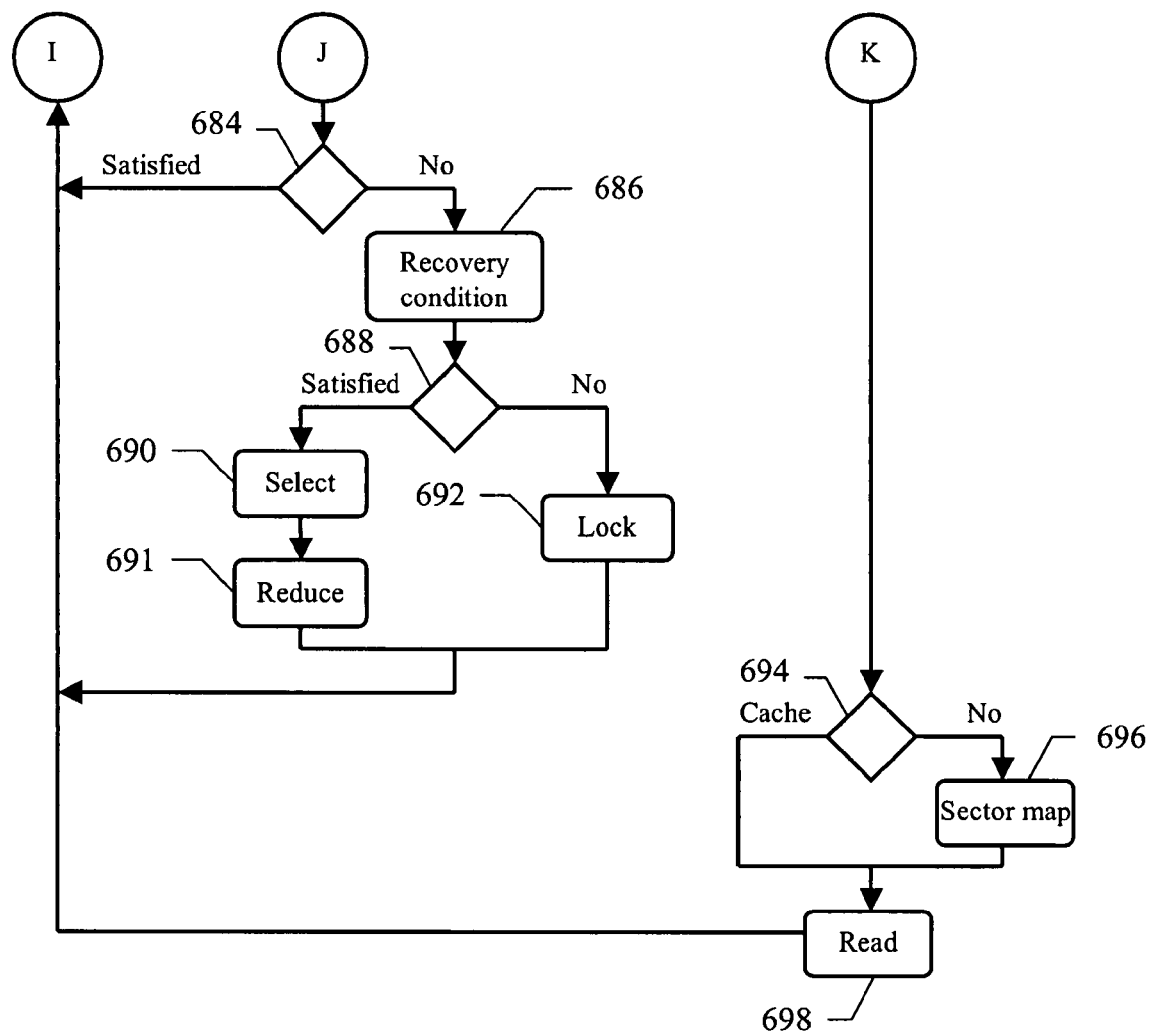

Moving to FIGS. 5A-5C, a proposed implementation of the above-mentioned mapping structure according to an embodiment is illustrated. With reference in particular to FIG. 5A, the mapping structure includes a block map 505 that associates each logical block with the corresponding (root and leaf) physical blocks. For this purpose, the block map 505 has an entry for each logical block (in a position corresponding to its logical block number). The entry of the block map 505 includes a root field and a leaf field. If the logical block is written, the root field indicates the associated root physical block (by means of its physical block number). Otherwise, if the logical block is empty the root field has a null value. When the logical block is written (root field different from null), the leaf field indicates the associated leaf physical block if any (again by means of its physical block number). Otherwise, if no leaf physical block is associated with the written logical block, the leaf field has the null value.

For example, as shown in the figure, let us consider a very simplified scenario wherein the physical memory space 255 only includes 8 physical blocks identified by the corresponding physical block numbers (from PB=0 to PB=7). The physical memory space 255 is used to map a logical memory space of 5 logical blocks (again denoted with LB0-LB4). The block table 505 then includes 5 entries from LB=0 to LB=4. In the example at issue, the entry LB=0 indicates that the corresponding logical block LB0 is stored in the root physical block PB=2 and in the leaf physical block PB=4. The entries LB=1 and LB=4 instead indicate that the corresponding logical blocks LB1 and LB4 are stored in the root physical blocks PB=7 and PB=3, respectively (with no leaf physical blocks). At the end, the entries LB=2 and LB=3 indicate that the corresponding logical blocks LB2 and LB3 are empty.

Passing to FIG. 5B, for each physical block that is used (as a root or leaf physical block for a corresponding logical block), the mapping structure then includes a corresponding tree node 510. The tree node has a number field, which stores the corresponding physical block number. A program field is instead used to store an indication of its last physical sector that is programmed (by means of the corresponding physical offset, from PS=0 to PS=255 in the example at issue). In this way, when the used physical block is full the program field will be equal to the total number of physical sectors of the used physical block (i.e., 255); otherwise, the program field plus one will indicate the next erased physical sector (being available to be programmed). At the end, the tree node 510 includes a position field that indicates whether the used physical block is a root node or a leaf node (for example, by means of the values 1 and 2, respectively).

Particularly, the figure shows the tree nodes 510 for the above described physical memory space (with the used physical blocks PB=2-PB=4 and PB=7). In this case, the used physical blocks PB=2, PB=3 and PB=7 are root nodes (position field equal to 1) and the used physical block PB=4 is a leaf node (position field equal to 2). The used physical block PB=2 is full since all its physical sectors are programmed—as illustrated with a gray color (written field equal to 255), while the other used physical blocks PB=3, PB=4 and PB=7 still have some physical sectors that are erased—as illustrated in white color (written field lower than 255).

With reference now to FIG. 5C, for each used physical block the mapping structure further includes a sector map 515. As above, the sector map 515 has a number field storing the corresponding physical block number. The sector map 515 then includes a sector array, which is formed by a sector field for each logical sector of the associated logical block—in a position corresponding to its logical offset (i.e., from LS=0 to LS=255 in the example at issue). If the logical sector is written, the sector field indicates the associated physical block (by means of its physical offset PS=0 . . . 255), which stores the last version thereof. Otherwise, if the logical sector is empty the sector field should take another value (indicating that the logical sector is not written in any physical sector). It should be noted that in this case the last version of the logical sector and the empty logical sector are in relative terms only with respect to the physical block at issue. In other words, when the physical block is a root node and a leaf physical block is also associated with the same logical block, the actual last version of each logical sector might be stored in the leaf physical block. Likewise, when the physical block is a leaf node, each empty logical sector might instead be written in the root physical block.

In the example at issue wherein all the combinations that are possible with 1 byte=8 bits (i.e., 256—from 0 to 255) are used to identify the physical sectors, the provision of another value to indicate the empty logical sectors would require the use of an additional byte (assuming that the byte is the smallest unit of information that is treated by the storage device). In order to solve this problem, in an embodiment the physical offset of a predefined physical block (for example, PS=0) is also used in the sector field to indicate that the corresponding logical sector is empty. In this case, a validation field of the sector map 515 is then provided to solve the ambiguity arising from the use of the same value (0) for indication that the logical sector is empty or it is written in the first physical sector. For this purpose, the validation field stores the physical offset of the (single) logical sector that is written in the first physical block. In this way, all the others sector fields storing the same value 0 indicate that the corresponding logical sectors are empty.

The proposed solution strongly reduces the size of each sector map 515. Indeed, the validation field only requires a single additional byte (instead of the 256 bytes that would be required to identify the empty logical sectors with a dedicated value in each sector field).

It should be noted that, once the validation field has been set to the logical offset of the logical sector being written into the first physical sector (at the first write operation on the physical block), its value may remain unchanged—even if a next version of the same logical sector is written into another physical sector. This does not cause any problem, since the corresponding sector field will include the correct physical offset of the physical sector wherein the last version of the logical sector is stored. However, it allows using a single byte for storing the validation field (without the need of an additional byte for a null value indicating that it is not valid any longer).

Particularly, the figure shows the sector maps for the root physical block PB=2 and the leaf physical block PB=4 that are associated with the logical block LB0. In this case, the sector map 515 of the root physical block PB=2 (number field equal to 2) indicates that the last version (in the root physical block) of the logical sectors LS=0, LS=1, LS=2, LS=3, LS=253 and LS=255 are stored in the physical sectors PS=33, PS=36, PS=103, PS=110, PS=51 and PS=222, respectively. The validation field indicates that the logical sector LS=253 was written in the first physical block. However, in this case one or more next versions of the same logical sector were written in other physical sectors (until the last one in the physical sector PS=51, as indicated in the corresponding sector field). As far as the sector fields including the value 0 are concerned (i.e., the ones for the logical sectors LS=252 and LS=254), they are not identified in the validation field; therefore, the corresponding logical sectors are empty (in the root physical block).

Likewise, the sector map 515 of the leaf physical block PB=4 (number field equal to 4) indicates that the last version (in the leaf physical block) of the logical sectors LS=2, LS=252 and LS=255 are stored in the physical sectors PS=70, PS=48 and PS=62, respectively. As far as the sector fields including the value 0 are concerned, the validation field indicates that the logical sector LS=1 is the one actually written in the first physical block; the other logical sectors associated with the sector fields including the value 0 but not indicated in the validation field (i.e., the logical sectors LS=0, LS=3, LS=253 and the LS=254) are instead empty (in the leaf physical block).

Therefore, the last versions of the logical sectors LS=1, LS=2, LS=252 and LS=255 are then written in the physical sectors PS=0, PS=70, PS=48 and PS=62, respectively, of the leaf physical block PB=4. The logical sectors LS=0, LS=3, LS=253 and LS=254 are instead empty in the leaf physical block PB=4. However, the last versions of the logical sectors LS=0, LS=3 and LS=253 are written in the physical sectors PS=33, PS=110 and PS=51, respectively, of the root physical block PB=2; the logical sector LS=254 (which is empty in the root physical block PB=2 as well) is actually not written in any physical sector.

The block map 505 and the tree nodes 510 for all the used physical blocks are created during the initialization of the storage device. Conversely, this is generally not possible for the sector maps 515 of all the used physical blocks (since this would require the use of a too large area of the working memory). Therefore, the sectors maps 515 are created, when an operation must be performed on each logical block, for the corresponding root physical block and leaf physical block (if any). In the solution according to an embodiment, for this purpose a cache structure is exploited. The cache structure has a predefined number of entries (such as 5-10) for corresponding sector maps. Each freshly created sector map is added to the cache structure (be removing the oldest one according to a FIFO policy). This avoids re-creating the sector map(s) when operations must be performed on logical blocks that were accessed recently—so that their sector map(s) are already available in the cache structure.

With reference now to FIG. 6A-6D, the logic flow of an exemplary process that can be implemented in the above-described storage device (to control its operation) is represented with a method 600.

The method begins at the black start circle 602 and then passes to block 604; in this phase, the bad block table is searched by scanning the physical blocks of the flash memory forwards (starting from the first one, until the physical block storing the bad block table is found, as indicated by the table flag of its first physical sector being asserted), and it is then read. Continuing to block 606, the unavailable list is created and populated with the bad physical blocks indicated in the bad block table.

A loop is then performed for each other physical block of the flash memory. The loop starts at block 608, wherein the service information of a current physical block—starting from the first one—is retrieved (from the spare area of its first physical sector). The method then branches at block 610 according to the condition of the (current) physical block. Particularly, if the physical block is erased the block 612 is executed, if the physical block is used the blocks 614-616 are executed, and if the physical block is bad the block 618 is executed. In any case, the method then passes to block 620.

Considering now block 612, this branch is followed when the physical block is identified as erased (for example, when a corresponding flag in the spare area of its first physical sector is asserted). In this case, a new entry for the erased physical block (identified by its physical block number) is added to the free list, in the correct position corresponding to its number of erasures (as indicated in the aging block table previously loaded). The flow of activity then descends into block 620.

With reference instead to block 614, this branch is followed when the physical block is identified as used (for example, when a corresponding flag in the spare area of its first physical sector is asserted). In this case, the physical block number of the physical block is inserted into the entry of the corresponding logical block in the block map, and more specifically into the root field or into the leaf field according to its position in the tree structure (as indicated in the spare area of the first physical sector). Continuing to block 616, a new tree node for the used physical block is then created, with its physical block number in the number field, the physical offset of its last programmed physical sector in the program field, and the value indicating whether it is a root node or a leaf node in the position field (again as indicated in the spare area of the first physical sector). The flow of activity then descends into block 620.

Moving at the end to block 618, this branch is followed when the physical block is identified as bad (since the corresponding bad block flag is asserted). In this case, a new entry for the bad physical block (identified by its physical block number) is added to the unavailable list. The flow of activity then descends into block 620.

Considering now block 620, a test is made to verify whether all the physical blocks of the flash memory have been processed. If not, the method returns to block 608 to repeat the same operations for a next physical block. Conversely, the storage device enters a waiting condition at block 622.

As soon as any operation is required on the storage device, the process descends into block 624. The method then branches at block 626 according to the type of the desired operation. Particularly, if a format operation is required the blocks 628-640 are executed, if a write operation is required the blocks 642-692 are executed, and if a read operation is required the blocks 694-698 are executed. In any case, the method then returns to block 622 waiting for the request of a next operation. Conversely, when the storage device is switched off, the method ends at the concentric white/black stop circles 699.

Considering now block 628 (format operation), a loop is performed for each physical block of the flash memory; the loop starts by attempting to erase a (current) physical block. A test is then made at block 630 to verify a result of the erase operation. If the erase operation succeeded, the (erased) physical block is added to the free list at block 632. Conversely, if the erase operation failed, the bad block flag is asserted into the (bad) physical block at block 634. Continuing to block 636, the corresponding bad flag (for the bad block table) is asserted as well (starting from a condition wherein all the bad flags are deasserted). In both cases (physical block either erased or bad), the method then descends into block 638. In this phase, there is verified whether the erase operation has been attempted on all the physical blocks of the flash memory. If not, the method returns to block 628 to repeat the same operations for a next physical block. Conversely, the bad block table so obtained (with the bad flags for the bad blocks being asserted) is saved at block 640 into the first erased physical block of the flash memory. The method then returns to block 622.

With reference instead to block 642 (write operation), the critical condition is evaluated. The flow of activity then branches at block 644 according to the result of the evaluation. Particularly, when the critical condition is satisfied the blocks 646-656 are executed, whereas the blocks 658-672 are executed otherwise; in both cases, the method then passes to block 674.

Considering now block 646 (critical condition satisfied, meaning that the flash memory entered the critical status), a test is made to determine whether the write operation involves an increase of the used physical blocks (root physical block full or empty logical block). If so, the used physical block having the minimum number of programmed physical sectors is selected at block 648. Continuing to block 650, a garbage collection procedure is performed on the logical block associated with the selected leaf physical block (so that its old root and leaf physical blocks are compacted onto a new root physical block, and their erasure is then attempted). The method then verifies at block 652 the result of the garbage collection procedure. When one or more physical blocks have been not erased successfully (i.e., the old root and/or the old leaf physical blocks became bad), a test is made at block 654 to verify whether a further garbage collection procedure can be performed; this is true when at least one more leaf physical block and at least one erased physical block remained. If so, the method returns to block 648 to repeat the same operations described above. Conversely, the storage device is locked in read-only mode at block 656 (and the write operation is rejected). The method then returns to block 622 (for formatting the flash memory—after saving the stored data—so as to restore its operation). Referring back to block 652, when both the old root and the old leaf physical blocks have been erased successfully, the flow of activity descends into block 674. The same point is also reached from block 646 directly when the write operation does not involve any increase of the used physical blocks (i.e., it only involves the programming of a physical sector in an existing root or leaf physical block being not full).

With reference instead to block 658 (critical condition not satisfied), the safe condition is evaluated. The method when verifies at block 660 whether the safe condition is satisfied. If not (meaning that the flash memory left the safe status), a test is made at block 662 to determine whether the write operation involves an increase of the leaf physical blocks (root physical block full). If so, the leaf physical block having the minimum number of programmed physical sectors is selected at block 664. Continuing to block 666, a garbage collection procedure is performed on the logical block associated with the selected leaf physical block (so that its old root and leaf physical blocks are compacted onto a new root physical block, and their erasure is then attempted). The method then verifies at block 668 the result of the garbage collection procedure. When one or more physical blocks have been not erased successfully (i.e., the old root and/or the old leaf physical blocks became bad), a test is made at block 670 to verify whether a further garbage collection procedure can be performed; this is true when at least one more leaf physical block and at least one erased physical block remained. If so, the method returns to block 664 to repeat the same operations described above. Conversely, the storage device is locked in read-only mode at block 672 (and the write operation is rejected); the method then returns to block 622 (for formatting the flash memory—after saving the stored data—so as to restore its operation). Referring back to block 668, when both the old root and the old leaf physical blocks have been erased successfully, the flow of activity descends into block 674. The same point is also reached directly from block 662 when the write operation does not involve any increase of the leaf physical blocks (i.e., it involves the writing of an empty logical block or the programming of a physical sector in an existing root or leaf physical block being not full), or from block 640 when the safe condition is satisfied (meaning that the slash memory is still in the safe status).

With reference now to block 674, when a new physical block must be used (as a root node or as a leaf node), the first erased physical block is extracted from the free list. A test is now made at block 676 to determine whether the sector maps for the root physical block and the leaf physical block (if any) associated with the logical block are available in the cache structure. If not, each missing sector map is created and added to the cache structure at block 678 (by removing the oldest one). Particularly, the new sector map (with the physical number of the corresponding physical block in the number field) is populated by scanning the physical block forwards (until all the programmed physical sectors have been processed or the end of the physical block is reached); for each programmed physical block, its physical offset is stored into the sector field (overwriting any previous value), in the position corresponding to the logical offset of the logical sector that is written therein (as indicated in its spare area). The logical offset of the logical sector that is written in the first physical sector is also stored into the validation field. The method then descends into block 680; the same point is also reached directly from block 676 when all the required sector map(s) are already available in the cache structure. At this point, the desired write operation is performed (at the same time updating the relevant sector map accordingly).

The flow of activity then continues to block 682, wherein the correctness condition is evaluated. The flow of activity branches at block 684 according to the result of the evaluation. When the correctness condition is not satisfied, the recovery condition is evaluated at block 686. Different branches are now followed at block 688 according to the result of this further evaluation. If the empty logical blocks are enough to satisfy the recovery condition, the minimum number of empty logical blocks required to satisfy it is selected at block 690 (starting from the end of the logical memory space). The selected empty logical blocks are removed at block 691 from the logical memory space. The method then returns to block 622. Referring back to block 688, when the recovery condition is not satisfied all the logical blocks are locked in read-only mode at block 692; the method again returns to block 622 (for formatting the flash memory—after saving the stored data—so as to restore its correct operation).

With reference at the end to block 694 (read operation), as above a test is made to determine whether the sector maps for the root physical block and the leaf physical block (if any) associated with the logical block are available in the cache structure. If not, each missing sector map is created and added to the cache structure at block 696 (as described above). The method then descends into block 698. The same point is also reached directly from block 694 when all the required sector map(s) are already available in the cache structure. At this point, the desired read operation is performed. The method then returns to block 622.

Naturally, in order to satisfy local and specific requirements, a person skilled in the art may apply to the solution described above many logical and/or physical modifications and alterations. More specifically, although the present disclosure has been described with a certain degree of particularity with reference to preferred embodiment(s) thereof, it should be understood that various omissions, substitutions and changes in the form and details as well as other embodiments are possible. Particularly, the proposed solution may even be practiced without the specific details (such as the numerical examples) set forth in the preceding description to provide a more thorough understanding thereof. Conversely, well-known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

Particularly, the proposed solution lends itself to be implemented with equivalent methods (by using similar steps, removing some non-essential steps, or adding further optional steps); moreover, the steps may be performed in a different order, concurrently or in an interleaved way (at least in part).

Similar considerations apply if the storage device emulates an equivalent logical memory space (with a different number and/or size of the logical blocks); likewise, the physical blocks may have a different size. In any case, the proposed number of spare blocks is merely illustrative and it must not be interpreted in a limitative manner.

Alternatively, the bad block table may have another structure (for example, consisting of a list of the physical block numbers of the bad physical blocks). Moreover, it is also possible to replace the unavailable list with an equivalent structure (for example, consisting of a chain implemented with pointers, a table, and the like).

The bad physical blocks may also be detected in response to other events (for example, even when a write operation fails).

The use of the bad block flags (or any equivalent indicators) is not strictly necessary. For example, nothing prevents updating the bad block table continuously according to the unavailable list (such as periodically or when the storage device is switched off).

The proposed solution lends itself to be implemented on a flash memory wherein each physical block or logical block includes physical sectors or logical sectors, respectively, with a different number and/or size. Alternatively, it is possible to implement the mapping of the logical memory space on the physical memory space with different techniques (for example, by associating a tree structure with a root node and multiple child nodes with each logical sector, by storing the required information in any other way, and the like).

As a consequence, the correctness condition changes accordingly.

Similar considerations apply to the number of empty logical blocks to be locked during the recovery procedure. Moreover, the recovery procedure may be implemented in a different way (for example, without compacting all the logical blocks at the beginning of it).

Nothing prevents selecting the empty logical blocks to be locked in a different way (for example, starting from the beginning of the logical memory space), or even without any constraint.

Moreover, it is possible to allow some further write operations on the storage device even when the recovery condition is not satisfied (by locking it only when this is not possible any longer).

Alternative algorithms are also feasible to force the garbage collection procedure. For example, when the erasure of each physical block is postponed by inserting it into an invalid list (as described in the co-pending patent application entitled MANAGEMENT OF ERASE OPERATIONS IN STORAGE DEVICES BASED ON FLASH MEMORIES Ser. No. 11/801,742, the entire disclosure of which is herein incorporated by reference to the maximum extent allowable by law), it is possible to try erasing one (invalid) physical block before invoking the garbage collection procedure. Moreover, it is also possible to implement an algorithm for restoring the storage device when a power loss occurs during the garbage collection procedure (as described in the co-pending patent application entitled RESTORING STORAGE DEVICES BASED ON FLASH MEMORIES AND RELATED CIRCUIT, SYSTEM AND METHOD Ser. No. 11/801,687, the entire disclosure of which is herein incorporated by reference to the maximum extent allowable by law).

Similar considerations apply if the safe condition is defined in a different way.

Likewise, the erasing of one invalid physical block may also be attempted before invoking the garbage collection procedure when the flash memory enters the critical status.

As above, it is possible to define the critical condition in a different way.

Nothing prevents selecting the logical block on which the garbage collection procedure should be performed in a different way (for example, simply according to a round-robin policy).

The proposed block map, tree nodes and/or sector map are not strictly necessary, and they may be replaced (in whole or in part) with a standard mapping structure. Vice-versa, it should be noted that these additional features are suitable to be used (alone or combined with the other additional features) even without the above-described dynamic bad block management technique. Of course, similar considerations apply if the empty logical sectors are indicated with a value equal to the physical offset of any other predefined physical sector (such as the last one).

Even though in the preceding description reference has been made to a flash memory with NAND architecture, this is not to be interpreted in a limitative manner. More generally, the proposed solution lends itself to be used in a storage device based on any other flash memory (for example, of the NOR type, of the phase-change type, and the like), or other types of memories having block erase requirements.

Similar considerations apply if the program (which may be used to implement each embodiment) is structured in a different way, or if additional modules or functions are provided. Likewise, the memory structures may be of other types, or may be replaced with equivalent entities (not necessarily consisting of physical storage media). In any case, the program may take any form suitable to be used by or in connection with any control system of the storage device, such as software, firmware, or microcode. Moreover, it is possible to provide the program on any medium being adapted to be used by the control system; the medium can be any element suitable to contain, store, communicate, propagate, or transfer the program. For example, the medium may be of the electronic, magnetic, optical, electromagnetic, infrared, or semiconductor type; examples of such medium are the flash memory itself or a ROM (where the program can be pre-loaded), wires, wireless connections, broadcast waves, and the like. In any case, the solution according to the present disclosure lends itself to be implemented with a hardware structure (for example, integrated in a chip of semiconductor material), or with a combination of software and hardware.

Alternatively, the control system (being used to manage the storage device) may have a different structure or it may include equivalent components.

Likewise, the above-described architecture of the storage device is merely illustrative, and it should not be interpreted in a limitative manner.

It should be readily apparent that the proposed structure might be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards).

In any case, it should be noted that the storage device may be used in any other data processing system; further examples of such system are an MP3 player, a digital camera, a PDA, a laptop computer, and the like From the foregoing it will be appreciated that, although specific embodiments have been described herein for purposes of illustration, various modifications may be made without deviating from the spirit and scope of the present disclosure.

What is claimed is:

1. A method for managing a storage device based on a flash memory, the method comprises:
   mapping a logical memory space of the storage device, including a plurality of logical blocks, on a physical memory space of the flash memory, including a plurality of physical blocks adapted to be erased individually, the physical blocks including a set of first physical blocks corresponding to the logical blocks and a set of second physical blocks for replacing each bad physical block being unusable, the set of second physical blocks being unreserved ones of the physical blocks in the physical memory space and being indistinguishable from the set of first physical blocks, detecting each bad physical block, and
   discarding each bad physical block to prevent using the bad physical block for mapping the logical memory space;
   wherein each logical block includes a plurality of logical sectors adapted to be written repeatedly, and wherein each physical block includes a plurality of physical sectors adapted to be programmed once, consecutive versions of the logical sectors of each logical block being stored in succession in the physical sectors of a root physical block and at least one child physical block when the root physical block is full;
   wherein a number of the second physical blocks is at least equal to 2; and
   wherein the method further comprises:
     verifying whether the flash memory satisfies a correctness condition, wherein the number of the second physical blocks minus the number of the bad physical blocks is greater than or equal to 2,
     verifying whether the flash memory satisfies a recovery condition, wherein the number of empty logical blocks having no logical sector being written is at least equal to 2 plus the number of the bad physical blocks minus the number of the second physical blocks, in response to the correctness condition being not satisfied,
     selecting a minimum number of the empty logical blocks required to satisfy the recovery condition in response to the recovery condition being satisfied, and
     reducing the logical memory space by removing the selected empty logical blocks.

2. The method according to claim 1, wherein the step for detecting each bad physical block includes:
   storing a bad block structure into the flash memory, the bad block structure including an indication of the bad physical blocks, and
   loading a further bad block structure into a working memory of the storage device at an initialization of the storage device, the further bad block structure being loaded by adding an indication of each bad physical block included in the bad block structure.

3. The method according to claim 2, wherein the step for detecting each bad physical block further includes:
   detecting each new bad physical block during operation of the storage device in response to a failure of a corresponding erase operation, and
   adding an indication of each new bad physical block to the further bad block structure.

4. The method according to claim 3, wherein the bad block structure is stored during a format operation of the flash memory attempting to erase all the physical blocks,
   the step for detecting each new bad physical block including asserting a bad block indicator into the new bad physical block, and
   the step for loading the further bad block structure at the initialization of the storage device including adding an indication of each new bad physical block, the new bad physical block being identified according to the corresponding bad block indicator.

5. The method according to claim 1, wherein the logical memory space is adapted to store payload data and meta data describing the payload data, the meta data being stored in a first portion of the logical memory space, the step for selecting the minimum number of the empty logical blocks including:
   selecting the minimum number of the empty logical blocks in a second portion of the logical memory space different from the first portion.

6. The method according to claim 1, further including the step for:
   locking all the logical blocks in response to the recovery condition being not satisfied for preventing writing each logical block.

7. The method according to claim 1, further including the steps:
   forcing a garbage collection procedure on a selected logical block for compacting an old root physical block and at least one old child physical block storing the selected logical block into a new root physical block storing the last versions only of the logical sectors of the selected logical block and attempting to erase the old root physical block and the at least one old child physical block, the garbage collection procedure being forced in response to the flash memory leaving a safe status, wherein the physical memory space ensures the writing of all the logical blocks, in response to each write operation increasing the number of the leaf physical blocks.

8. The method according to claim 7, wherein the step for forcing the garbage collection procedure includes:
forcing the garbage collection procedure when the flash memory enters a critical status, wherein the physical memory space only allows performing a single garbage collection procedure, in response to a write operation increasing the number of used physical blocks having at least one physical sector being programmed.

9. The method according to claim 8, further including the step for:
determining that the flash memory has entered the critical status when the number of the used physical blocks plus the number of the bad physical blocks is equal to the number of the physical blocks minus 1.

10. The method according to claim 7, wherein the step for forcing the garbage collection procedure includes:
selecting the at least one child physical block having the minimum number of physical sectors being programmed, and
selecting the logical block associated with the selected at least one child physical block for the garbage collection procedure.

11. The method according to claim 1, further including the step for:
defining a mapping structure for mapping each logical sector on an associated physical sector of a corresponding physical block storing the last version of the logical sector, wherein for each written logical block having at least one logical sector being written the mapping structure includes a sector map having a field for each logical sector of the written logical block, the field storing an indication of the associated physical sector when the logical sector is written or a value equal to the indication of a predefined physical sector of the written logical block when the logical sector is not written, and a further field for storing an indication of the logical sector being written in the predefined physical sector.

12. The method according to claim 1, wherein the flash memory is of the NAND type.

13. A software program product including a non-transitory computer-readable storage medium embodying a software program, the computer-readable storage medium being adapted to be used by a control system of a storage device based on a flash memory, wherein the software program when executed on the control system causes the control system to perform the method according to claim 1.

14. A control system for a storage device based on a flash memory, the control system including a control unit for performing the steps for the method according to claim 1.

15. A storage device based on a flash memory including the control system according to claim 14.

16. A data processing system including at least one storage device according to claim 14.

17. A method for mapping a logical memory space on to a physical memory space of a memory device, the method comprising:
defining a logical memory space including NL logical blocks;
defining a physical memory space having a total number of physical blocks NP being equal to the number of logical blocks NL plus a number of spare physical blocks NS greater than 2 that are indistinguishable and not distinct from other NP physical blocks, can include bad physical blocks and are interspersed within the physical blocks NP of the physical memory space;
detecting each bad physical block contained in the physical memory space to obtain identification information for the bad physical blocks;
storing the identification information for the bad physical blocks in a bad block data structure;
verifying a recovery condition, wherein a number of empty logical blocks having no logical sector being written is at least equal to 2 plus the number of the bad physical blocks minus the number of the spare physical blocks NS;
mapping, in response to the recovery condition being satisfied, each logical block directly on to at least one physical block in the physical memory space that is not one of the bad physical blocks to enable accesses to the physical blocks corresponding to each logical block to occur without utilizing the bad block data structure; and
during operation of the memory device, updating the bad block data structure responsive to an erase failure of any of the NP physical blocks.

18. The method of claim 17, wherein the bad block data structure comprises a plurality of flags, each flag associated with a corresponding physical block and the flag for each physical block being asserted when the physical block is bad and deasserted otherwise.

19. The method of claim 17, wherein the method further comprises generating a free list indicating the physical blocks that are erased and available for storing data.

20. The method of claim 19, wherein free list stores physical block numbers of the associated physical blocks contained in the free list with these physical block numbers being arranged in increasing order of the number of erasures the associated physical blocks.

21. The method of claim 17, wherein after the operation of mapping, any newly detected bad physical blocks are replaced with one of the physical blocks contained in a free list, the logical block associated with the newly detected bad physical block being directly mapped on to physical block in the free list.

22. The method of claim 21, wherein the method further comprises generation of an unavailable list including the bad block data structure plus newly detected bad physical blocks.

23. The method of claim 17, wherein the identification information for the bad physical blocks is initially stored in the bad block data structure during initialization of the memory device.

24. The method of claim 23, wherein updating the bad block data structure responsive to an erase failure of any of the NP physical blocks comprises setting bad block flags.

25. The method of claim 23, wherein updating the bad block data structure responsive to an erase failure of any of the NP physical blocks comprises continuously updating the bad block data structure to reflect bad blocks indicated in an unavailable list that is created in part during operation of the memory device.

26. The method of claim 25, wherein continuously updating the bad block data structure comprises periodically updating the bad block data structure during operation of the memory device.

27. The method of claim 25, wherein continuously updating the bad block data structure comprises updating the bad block data structure responsive to the memory device being switched off.

* * * * *